US011450567B2

(12) United States Patent
Cheng et al.

(10) Patent No.: US 11,450,567 B2
(45) Date of Patent: Sep. 20, 2022

(54) PACKAGE COMPONENT WITH STEPPED PASSIVATION LAYER

(71) Applicant: Taiwan Semiconductor Manufacturing Co., Ltd., Hsinchu (TW)

(72) Inventors: Ming-Da Cheng, Taoyuan (TW); Tzy-Kuang Lee, Hsinchu (TW); Song-Bor Lee, Zhubei (TW); Wen-Hsiung Lu, Tainan (TW); Po-Hao Tsai, Zhongli (TW); Wen-Che Chang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/085,731

(22) Filed: Oct. 30, 2020

(65) Prior Publication Data

US 2021/0375675 A1 Dec. 2, 2021

Related U.S. Application Data

(60) Provisional application No. 63/030,608, filed on May 27, 2020.

(51) Int. Cl.
*H01L 21/768* (2006.01)
*H01L 23/00* (2006.01)

(52) U.S. Cl.
CPC .. *H01L 21/76885* (2013.01); *H01L 21/76802* (2013.01); *H01L 21/76852* (2013.01); *H01L 21/76871* (2013.01); *H01L 24/05* (2013.01); *H01L 24/13* (2013.01); *H01L 24/32* (2013.01); *H01L 2224/0231* (2013.01); *H01L 2224/0235* (2013.01); *H01L 2224/0239* (2013.01); *H01L 2224/02331* (2013.01); *H01L 2224/0391* (2013.01); *H01L 2224/0401* (2013.01); *H01L 2224/05008* (2013.01); *H01L 2224/05022* (2013.01)

(58) Field of Classification Search
CPC .................................................. H01L 21/76885
See application file for complete search history.

(56) References Cited

U.S. PATENT DOCUMENTS

| | | | |
|---|---|---|---|
| 9,337,118 B2 | 5/2016 | Wang et al. | |
| 9,711,473 B1 | 7/2017 | Kuo et al. | |
| 2011/0186987 A1* | 8/2011 | Wang | H01L 23/3192 |
| | | | 257/737 |
| 2019/0139918 A1 | 5/2019 | Shindo | |

FOREIGN PATENT DOCUMENTS

| | | |
|---|---|---|
| TW | 201128751 A | 8/2011 |
| TW | 201731036 A | 9/2017 |

\* cited by examiner

*Primary Examiner* — William A Harriston
(74) *Attorney, Agent, or Firm* — Slater Matsil, LLP

(57) ABSTRACT

A method includes forming a first conductive feature, depositing a passivation layer on a sidewall and a top surface of the first conductive feature, etching the passivation layer to reveal the first conductive feature, and recessing a first top surface of the passivation layer to form a step. The step comprises a second top surface of the passivation layer. The method further includes forming a planarization layer on the passivation layer, and forming a second conductive feature extending into the passivation layer to contact the first conductive feature.

20 Claims, 28 Drawing Sheets

PACKAGE COMPONENT WITH STEPPED PASSIVATION LAYER

PRIORITY CLAIM AND CROSS-REFERENCE

This application claims the benefit of the U.S. Provisional Application No. 63/030,608, filed on May 27, 2020, and entitled "Semiconductor Package Device with stepped Passivation Layer," which application is hereby incorporated herein by reference.

BACKGROUND

In the formation of integrated circuits, integrated circuit devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

A redistribution line may then be formed to connect to the top surface of the metal pad, followed by the formation of a second polymer layer over the redistribution line. An Under-Bump-Metallurgy (UBM) is formed extending into an opening in the second polymer layer, wherein the UBM is electrically connected to the redistribution line. A solder ball may be placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
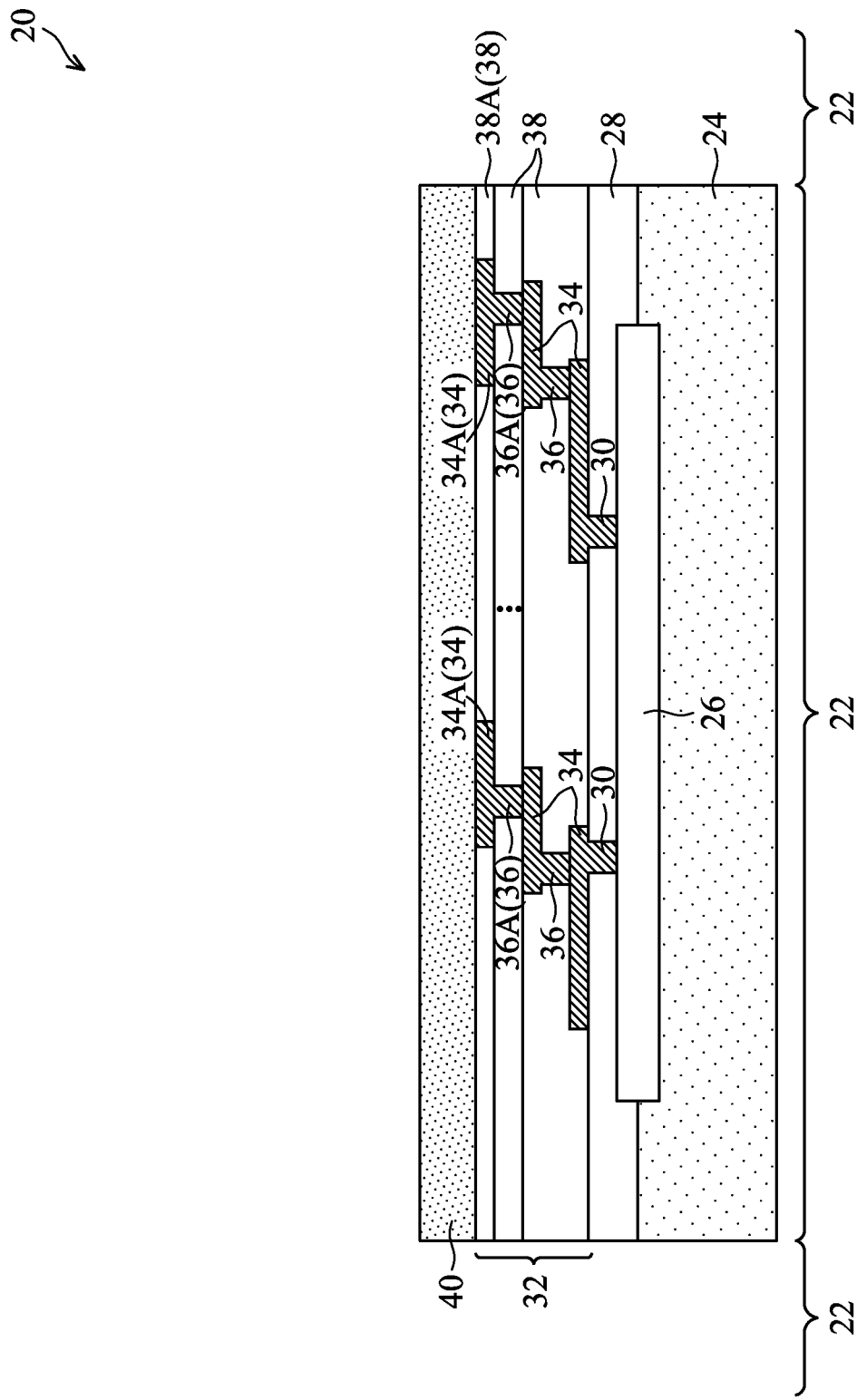
FIGS. 1 through 15 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device and the method of forming the same are provided in accordance with some embodiments. The device includes a redistribution line, a passivation layer on the redistribution line, and a polymer planarization layer on the passivation layer. An opening is formed in the passivation layer, so that another conductive feature such as an Under-Bump Metallurgy (UBM) may penetrate through the passivation layer to electrically connect to the redistribution line. The passivation layer is formed to have steps, so that the delamination between the polymer planarization layer and the passivation layer can be reduced. The intermediate stages in the formation of the package are illustrated in accordance with some embodiments. Some variations of some embodiments are discussed. Throughout the various views and illustrative embodiments, like reference numbers are used to designate like elements.

Figure 27:
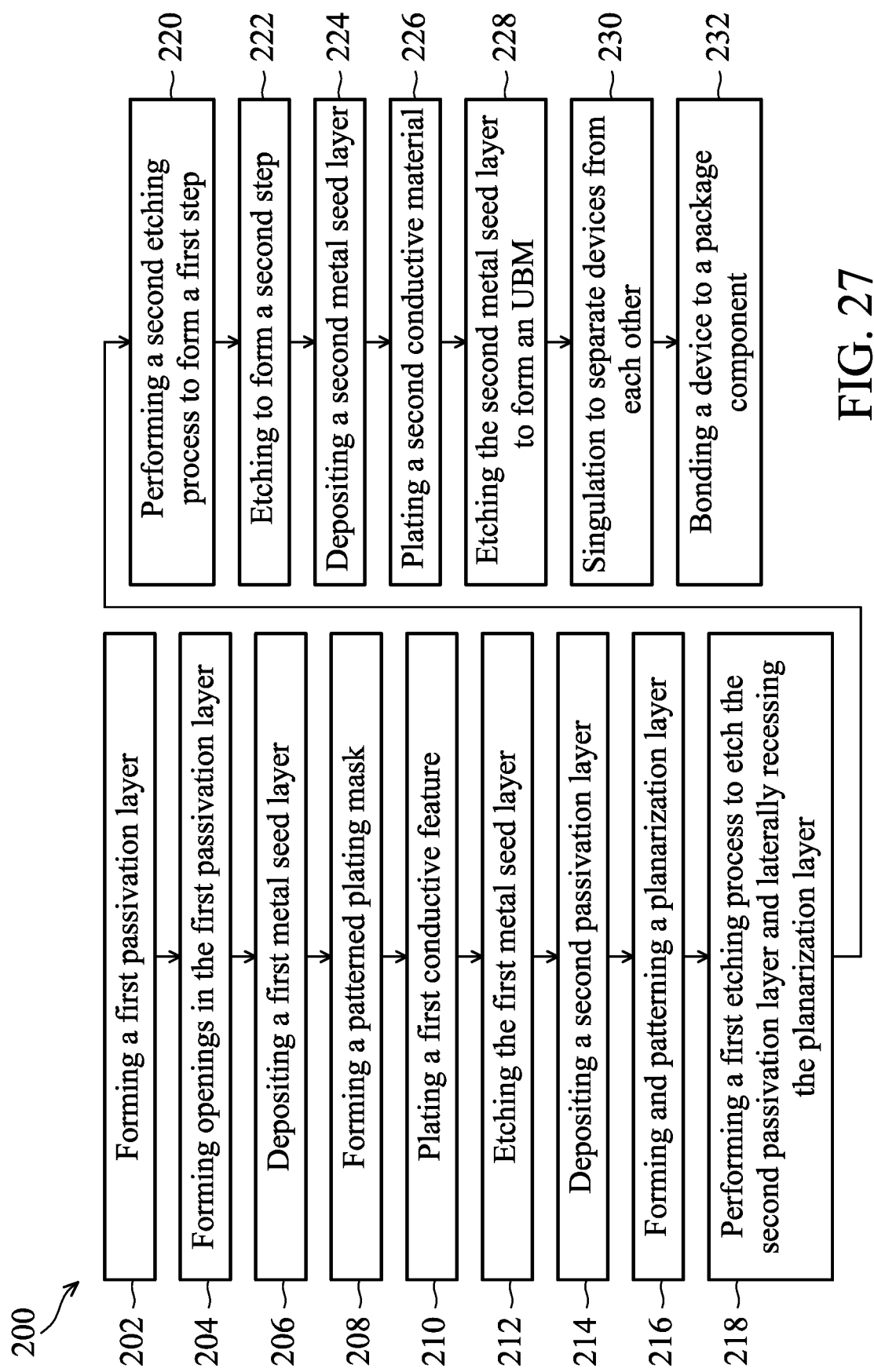
FIG. 27 illustrates a process flow for forming a device in accordance with some embodiments.

FIGS. 1 through 15 illustrate the cross-sectional views of intermediate stages in the formation of a device in accordance with some embodiments of the present disclosure. The corresponding processes are also reflected schematically in the process flow 200 as shown in FIG. 27. It is appreciated that although a device wafer and a device die are used as examples, the embodiments of the present disclosure may also be applied to form conductive features in other devices (package components) including, and not limited to, package substrates, interposers, packages, and the like.

FIG. 1 illustrates a cross-sectional view of integrated circuit device 20. In accordance with some embodiments of the present disclosure, device 20 is or comprises a device wafer including active devices and possibly passive devices, which are represented as integrated circuit devices 26. Device 20 may include a plurality of chips 22 therein, with one of chips 22 being illustrated. In accordance with alternative embodiments of the present disclosure, device 20 is an interposer wafer, which is free from active devices, and may or may not include passive devices. In accordance with yet alternative embodiments of the present disclosure, device 20 is or comprises a package substrate strip, which includes a core-less package substrate or a cored package substrate with a core therein. In subsequent discussion, a device wafer is used as an example of device 20, and device 20 may also be referred to as wafer 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon nitride, silicon oxynitride ($SiO_xN_y$), low-k dielectric materials, or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38 and then performing a curing process to drive out the porogen, and hence the remaining dielectric layers 38 are porous.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 36A) in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A may also be formed of copper or a copper alloy, and may have a dual damascene structure or a single damascene structure. Dielectric layer 38A is sometimes referred to as a top dielectric layer. The top dielectric layer 38A and the underlying dielectric layer 38 that is immediately underlying the top dielectric layer 38A may be formed as a single continuous dielectric layer, or may be formed as different dielectric layers using different processes, and/or formed of materials different from each other.

Passivation layer 40 (sometimes referred to as passivation-1 or pass-1) is formed over interconnect structure 32. The respective process is illustrated as process 202 in the process flow 200 as shown in FIG. 27. In accordance with some embodiments, passivation layer 40 is formed of a non-low-k dielectric material having a dielectric constant equal to or greater than the dielectric constant of silicon oxide. Passivation layer 40 may be formed of or comprise an inorganic dielectric material, which may include a material selected from, and is not limited to, silicon nitride ($SiN_x$), silicon oxide ($SiO_2$), silicon oxy-nitride ($SiON_x$), silicon oxy-carbide ($SiOC_x$), or the like, combinations thereof, and/or multi-layers thereof. The value "x" represents the relative atomic ratio. In accordance with some embodiments, the top surfaces of top dielectric layer 38A and metal lines 34A are coplanar. Accordingly, passivation layer 40 may be a planar layer. In accordance with alternative embodiments, the top conductive features protrude higher than the top surface of the top dielectric layer 38A, and passivation layer 40 is non-planar.

Figure 2:
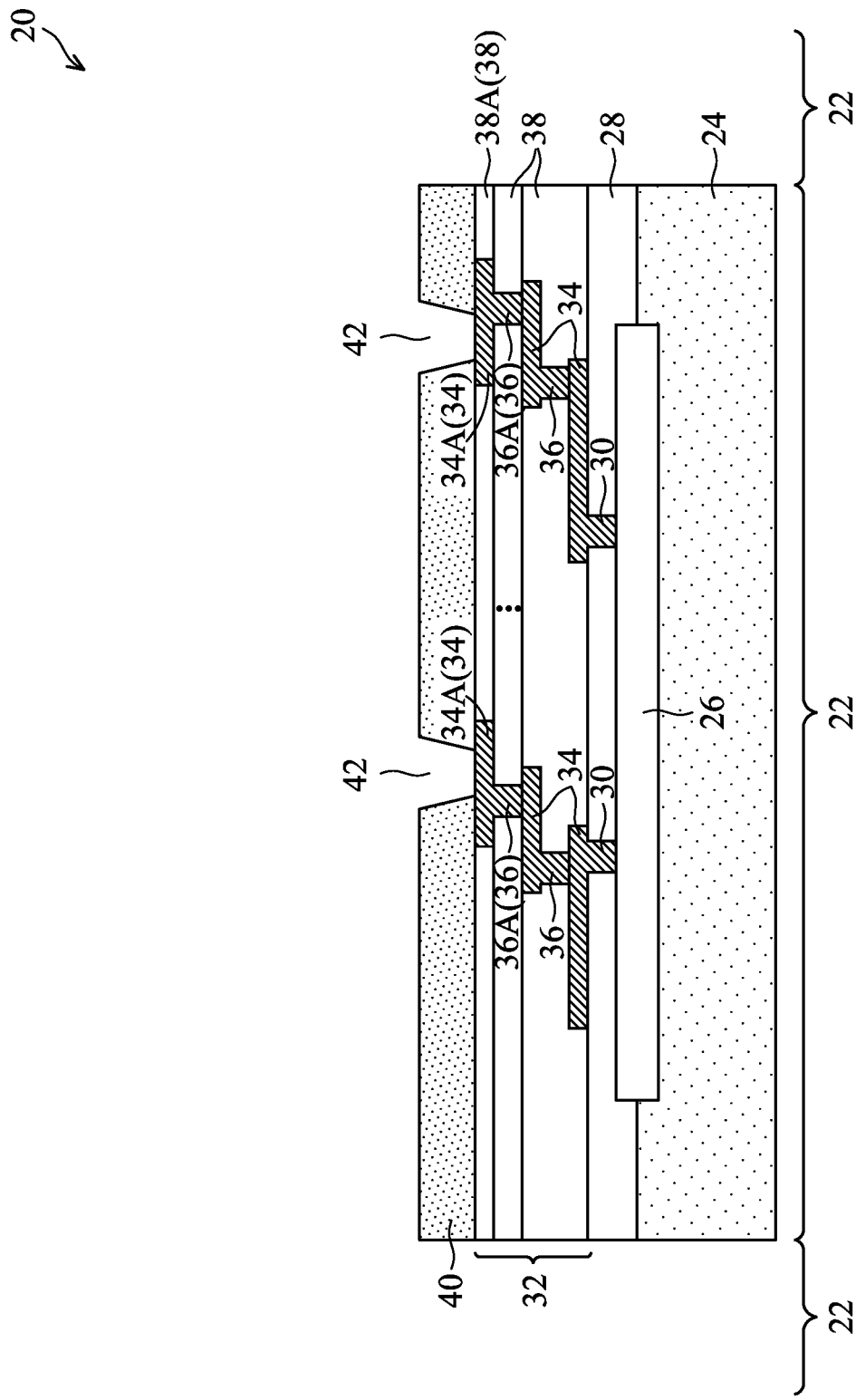

Referring to FIG. 2, passivation layer 40 is patterned in an etching process to form openings 42. The respective process is illustrated as process 204 in the process flow 200 as shown in FIG. 27. The etching process may include a dry etching process, which includes forming a patterned etching mask (not shown) such as a patterned photo resist, and then etching passivation layer 40. The patterned etching mask is then removed. Metal lines 34A are exposed through openings 42.

Figure 3:
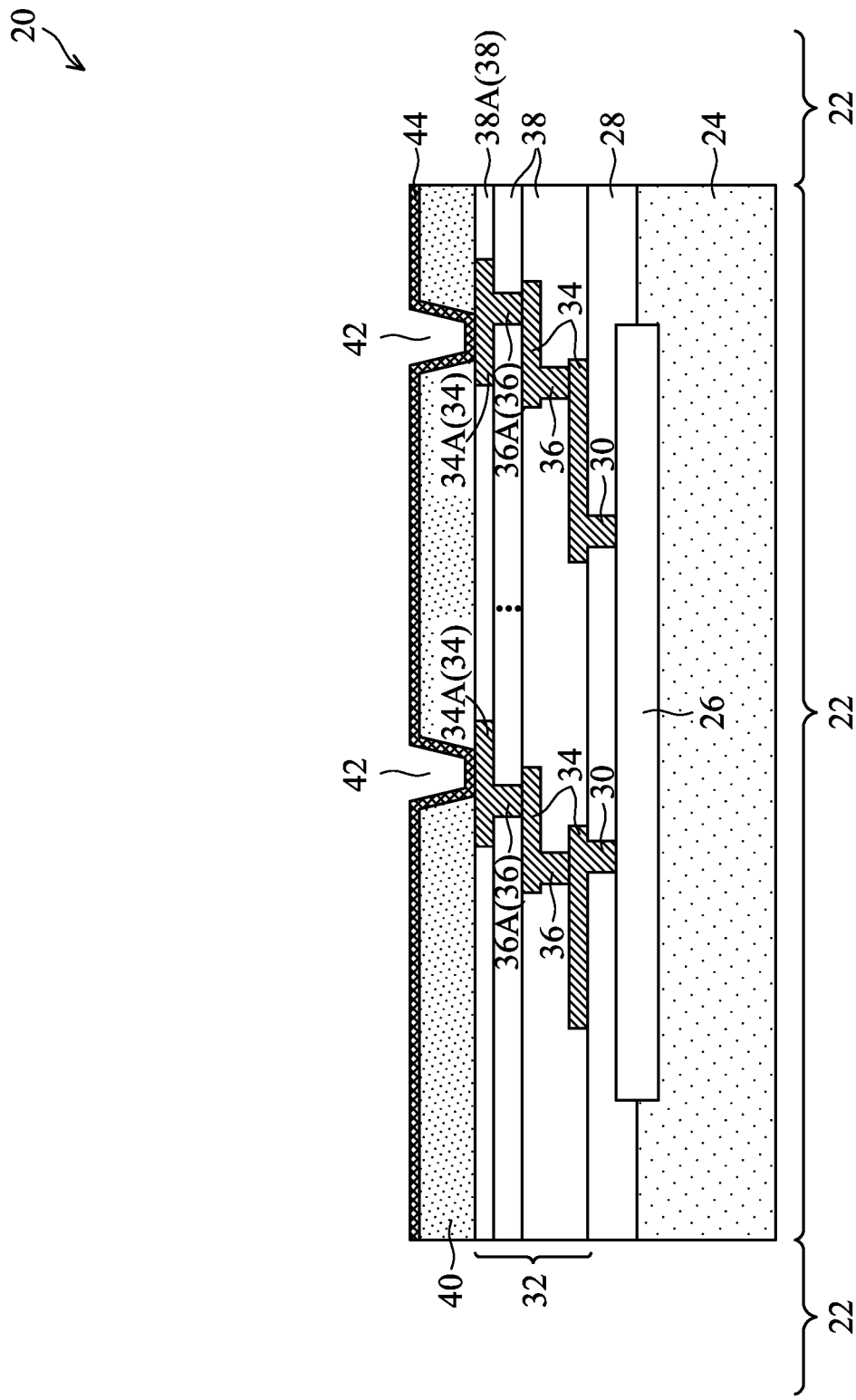

FIG. 3 illustrates the deposition of metal seed layer 44. The respective process is illustrated as process 206 in the process flow 200 as shown in FIG. 27. In accordance with some embodiments, metal seed layer 44 comprises a titanium layer and a copper layer over the titanium layer. In accordance with alternative embodiments, metal seed layer 44 comprises a copper layer in contact with passivation layer 40. The deposition process may be performed using Physical Vapor Deposition (PVD), Chemical Vapor Deposition (CVD), Metal Organic Chemical Vapor Deposition (MOCVD), or the like.

Figure 4:
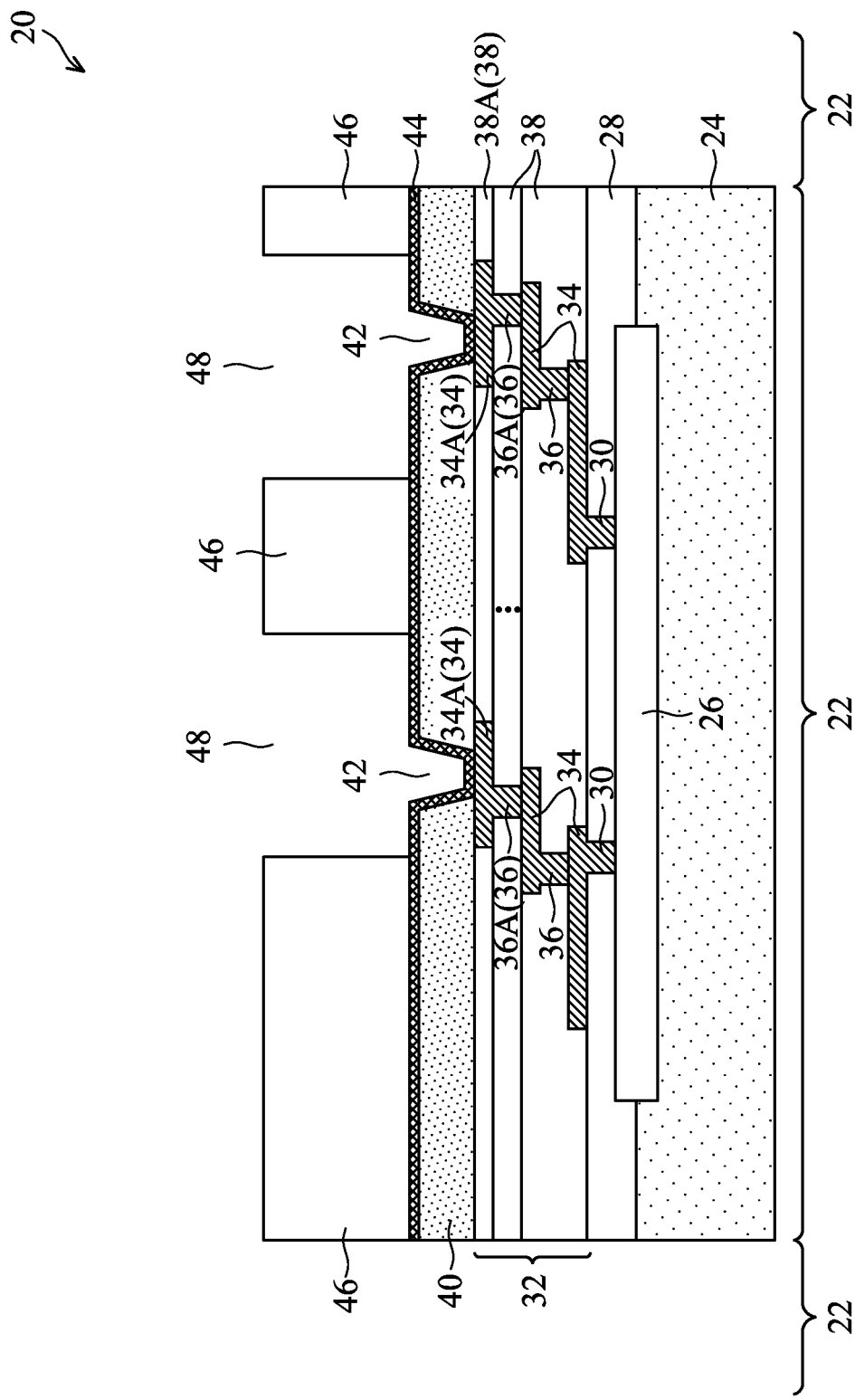

FIG. 4 illustrates the formation of patterned plating mask 46. The respective process is illustrated as process 208 in the process flow 200 as shown in FIG. 27. In accordance with some embodiments, plating mask 46 is formed of photo resist, and hence is alternatively referred to as photo resist 46. Openings 48 are formed in the patterned plating mask 46 to reveal metal seed layer 44.

Figure 5:
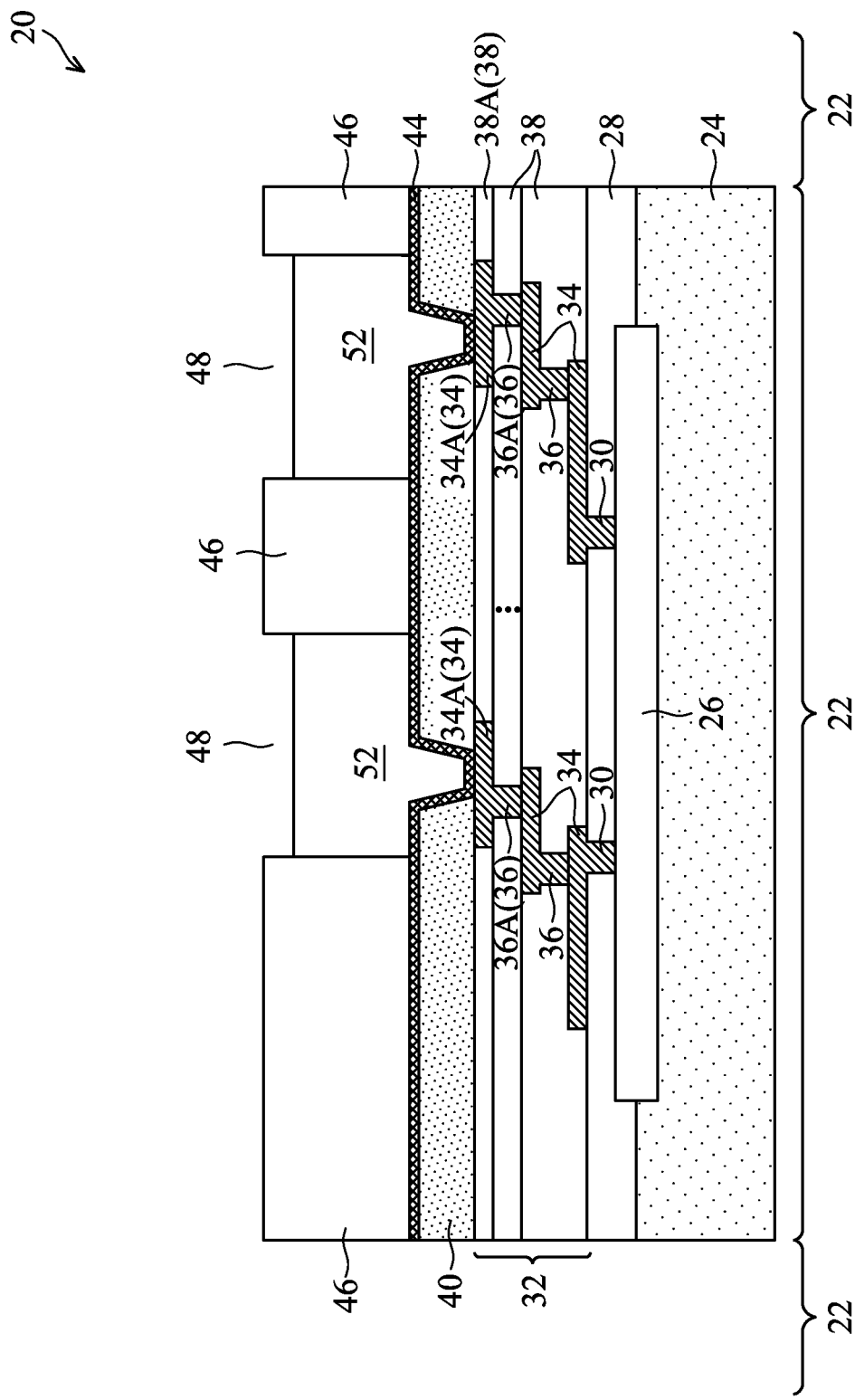

FIG. 5 illustrates the plating of conductive material (features) 52 into openings 48 and on metal seed layer 44. The respective process is illustrated as process 210 in the process flow 200 as shown in FIG. 27. In accordance with some embodiments of the present disclosure, the formation of conductive features 52 includes a plating process, which may include an electrochemical plating process, an electroless plating process, or the like. The plating is performed in a plating chemical solution. Conductive features 52 may include copper, aluminum, nickel, tungsten, or the like, or alloys thereof. In accordance with some embodiments, conductive features 52 comprise copper, and are free from aluminum.

Figure 6:
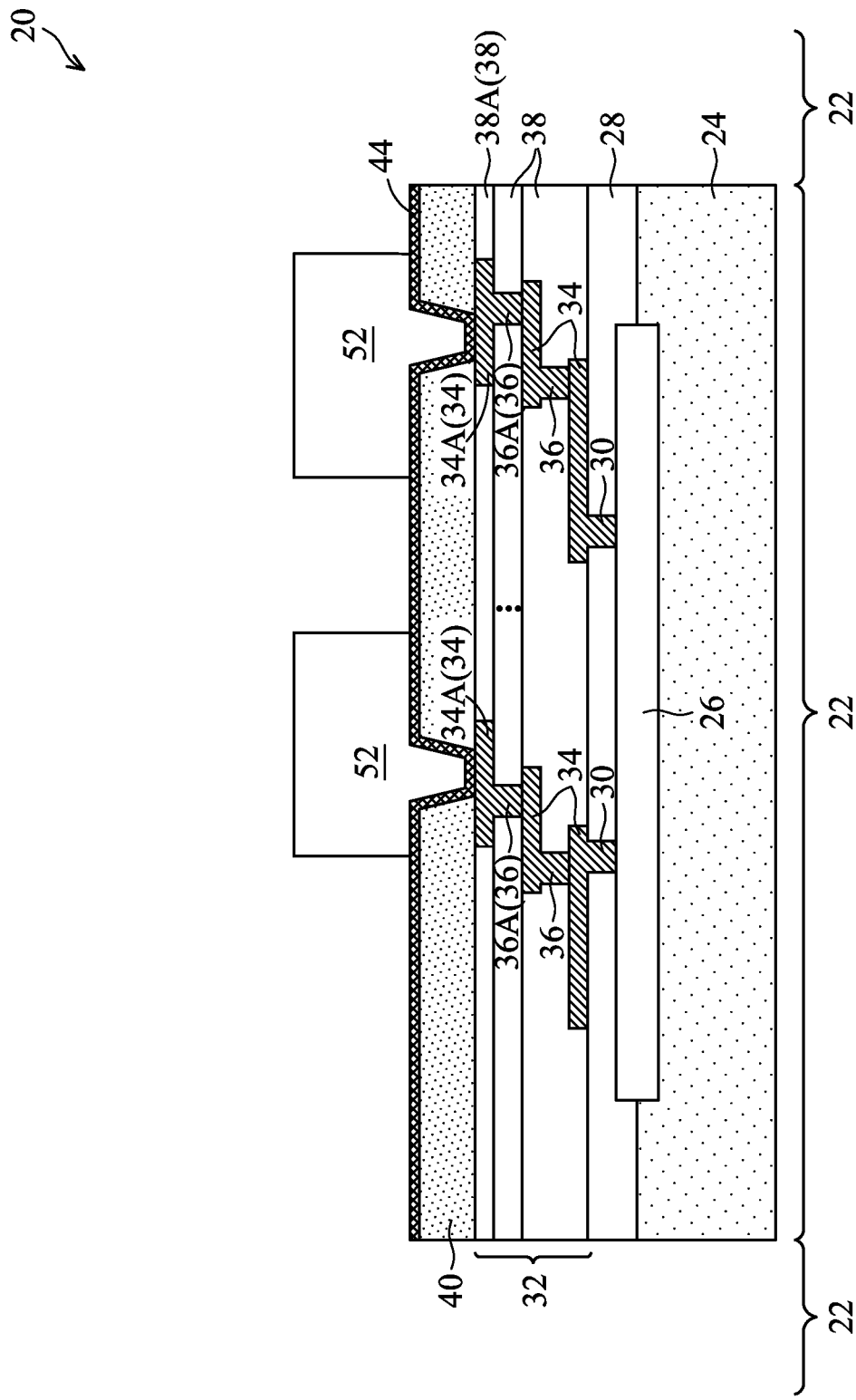
Figure 7:
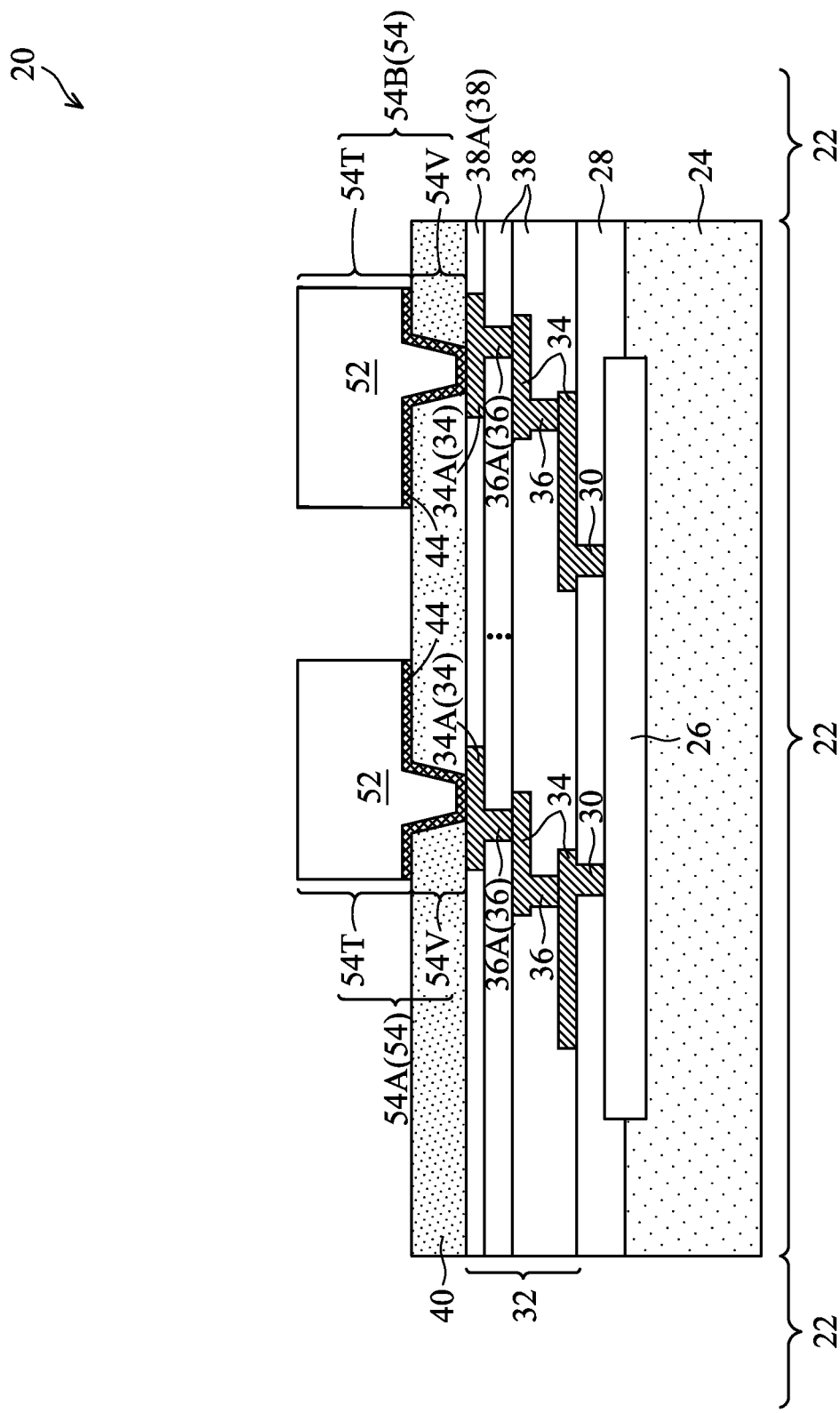

Next, photo resist (plating mask) 46 as shown in FIG. 5 is removed, and the resulting structure is shown in FIG. 6. In a subsequent process, an etching process is performed to remove the portions of metal seed layers 44 that are not protected by the overlying conductive features 52. The respective process is illustrated as process 212 in the process flow 200 as shown in FIG. 27. The resulting structure is shown in FIG. 7. Throughout the description, conductive features 52 and the corresponding underlying metal seed layers 44 are collectively referred to Redistribution Lines (RDLs) 54, which include RDL 54A and RDL 54B. Each of RDLs 54 may include a via portion 54V extending into passivation layer 40, and a trace/line portion 54T over passivation layer 40.

Figure 8:
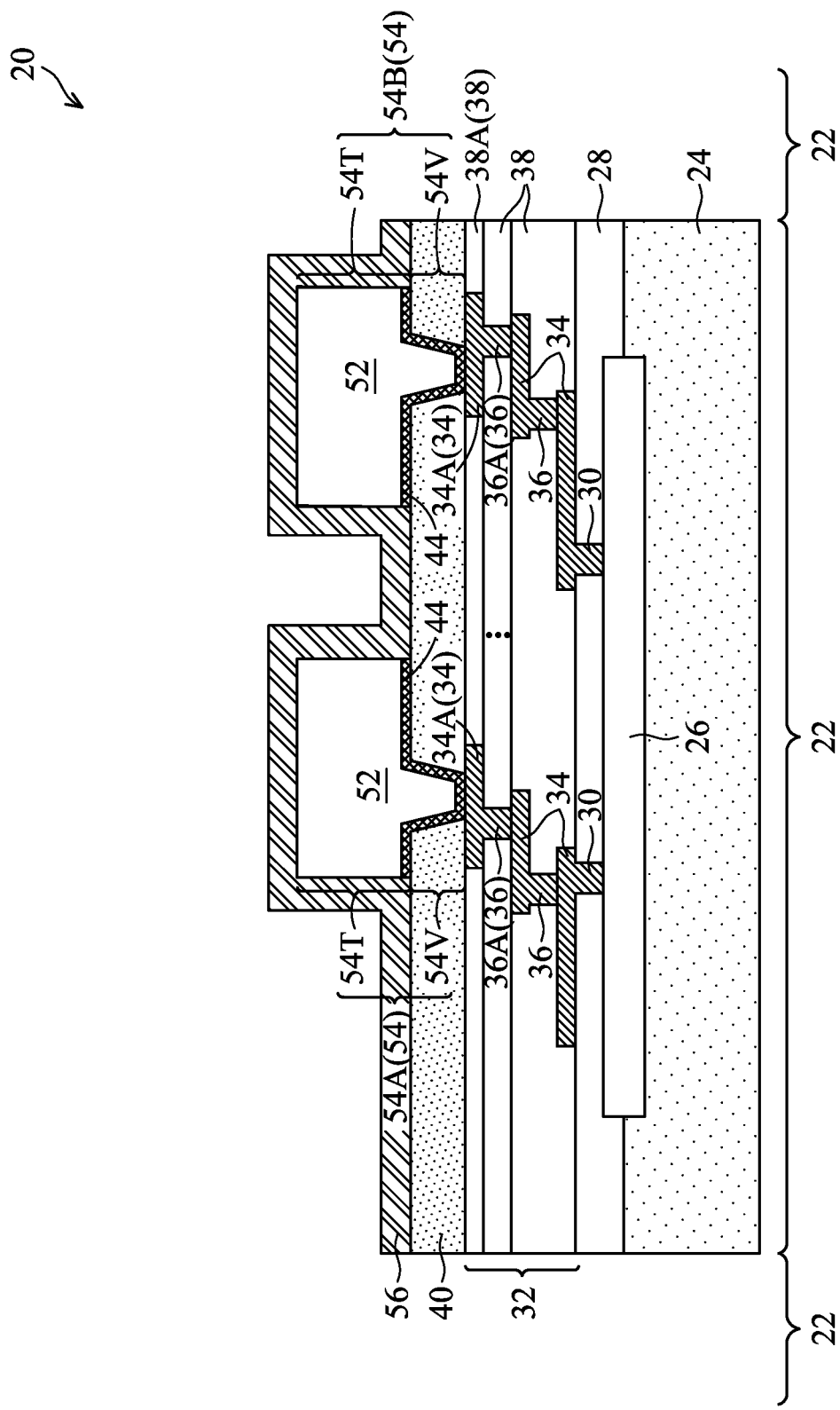

Referring to FIG. 8, passivation layer 56 is deposited. The respective process is illustrated as process 214 in the process flow 200 as shown in FIG. 27. Passivation layer 56 (sometimes referred to as passivation-2 or pass-2) is formed as a blanket layer. In accordance with some embodiments, passivation layer 56 is formed of or comprises an inorganic dielectric material, which may include, but is not limited to, silicon nitride, silicon oxide, silicon oxy-nitride, silicon oxy-carbide, or the like, combinations thereof, or multi-layers thereof. The material of passivation layer 56 may be the same or different from the material of passivation layer 40. The deposition may be performed through a conformal deposition process such as ALD, CVD, or the like. Accordingly, the vertical portions and horizontal portions of passivation layer 56 have the same thickness or substantially the same thickness, for example, with a variation smaller than about 20 percent or smaller than about 10 percent. It is appreciated that regardless of whether passivation layer 56 is formed of a same material as passivation layer 40 or not, there may be a distinguishable interface, which may be visible, for example, in a Transmission Electron Microscopy (TEM) image, an X Ray Diffraction (XRD) image, or an Electron Back Scatter Diffraction (EBSD) image of the structure.

Figure 9:
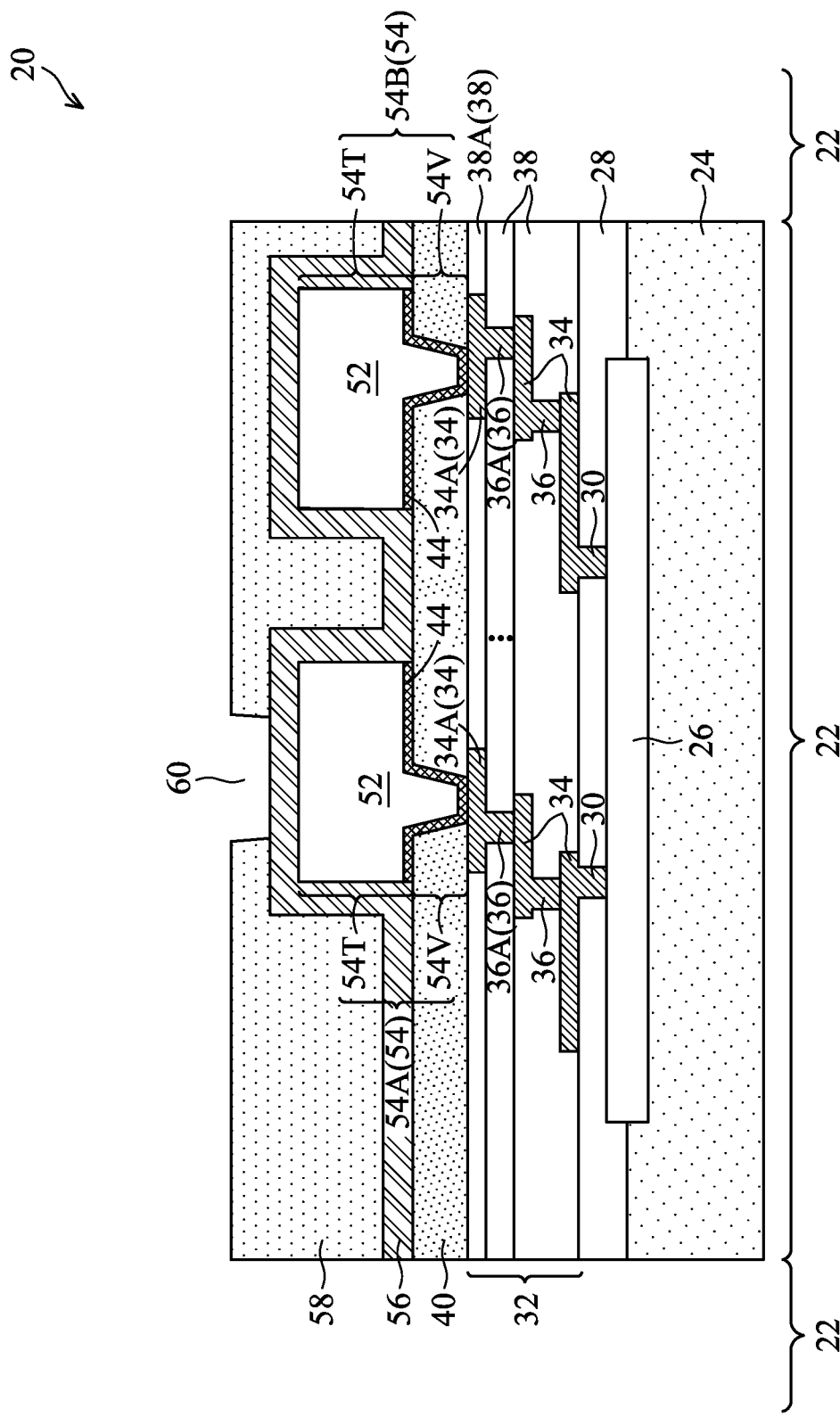

Referring to FIG. 9, planarization layer 58 is dispensed and then patterned, forming opening 60. The respective process is illustrated as process 216 in the process flow 200 as shown in FIG. 27. Planarization layer 58 may be formed of a polymer. The polymer may be photo sensitive or non-photo-sensitive. The photo sensitive polymer for forming planarization layer 58 may comprise polyimide, polybenzoxazole (PBO), benzocyclobutene (BCB), or the like. The patterning of planarization layer 58, when it is photo sensitive, may include performing a photo-exposure process on the planarization layer 58, and then developing planarization layer 58 to form opening 60. In accordance with alternative embodiments in which planarization layer 58 is non-photo-sensitive, for example, when planarization layer 58 comprises a non-photo-sensitive epoxy/polymer, the patterning of planarization layer 58 may include applying and patterning a photo resist over the planarization layer 58, and etching the planarization layer 58 using the patterned photo resist to define patterns of openings. The material of planarization layer 58 is selected so that in the subsequent etching processes, there is a suitable lateral etching rate in order to laterally recess planarization layer 58 and to form a step or steps.

Figure 10:
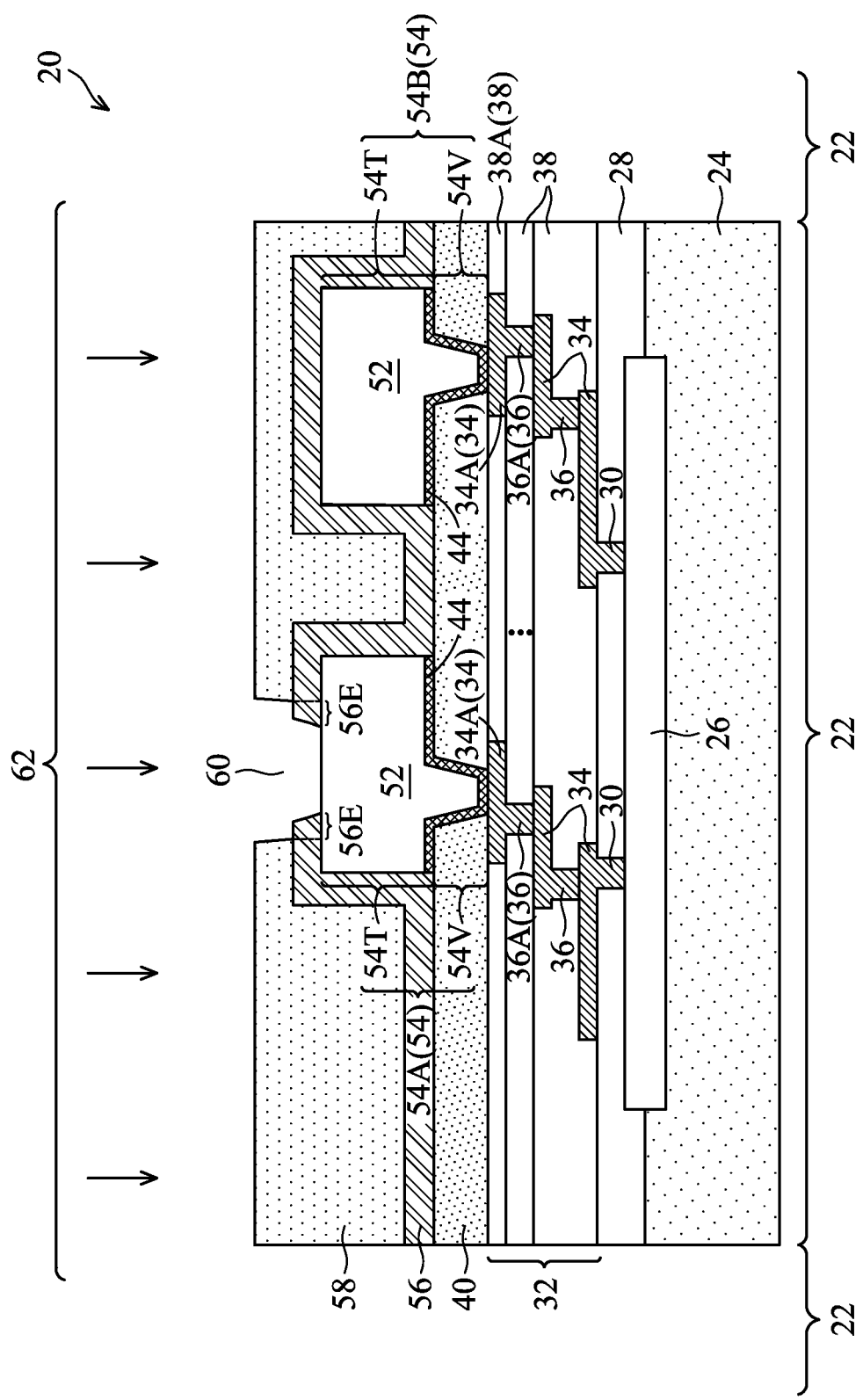

Referring to FIG. 10, etching process 62 is performed to etch-through passivation layer 56, so that opening 60 extends into passivation layer 56. The respective process is illustrated as process 218 in the process flow 200 as shown in FIG. 27. In accordance with alternative embodiments, the etching process 62 is performed through a Reactive Ion Etching (RIE) process. The etching gas may include a carbon-and-fluorine-containing gas, argon, oxygen ($O_2$), and nitrogen ($N_2$). The carbon-and-fluorine-containing gas may include $CF_4$, $CH_2F_2$, $CHF_3$, or the like, or combinations thereof, with the flow rate being in the range between about 200 sccm and about 500 sccm. The argon flow rate may be in the range between about 150 sccm and about 450 sccm. The oxygen flow rate may be in the range between about 10 sccm and about 120 sccm. The nitrogen flow rate may be in the range between about 20 sccm and about 140 sccm. The etching time may be in the range between about 35 seconds and about 60 seconds.

In accordance with other embodiments, etching process 62 is performed using argon as a main process gas. The etching process 62 (although referred to as being etching) actually includes a bombardment process, and may or may not include chemical etching effect. The chemical etching effect, if exists, is caused by the reactive gases such as the carbon-and-fluorine-containing gas and oxygen ($O_2$).

Figure 11:
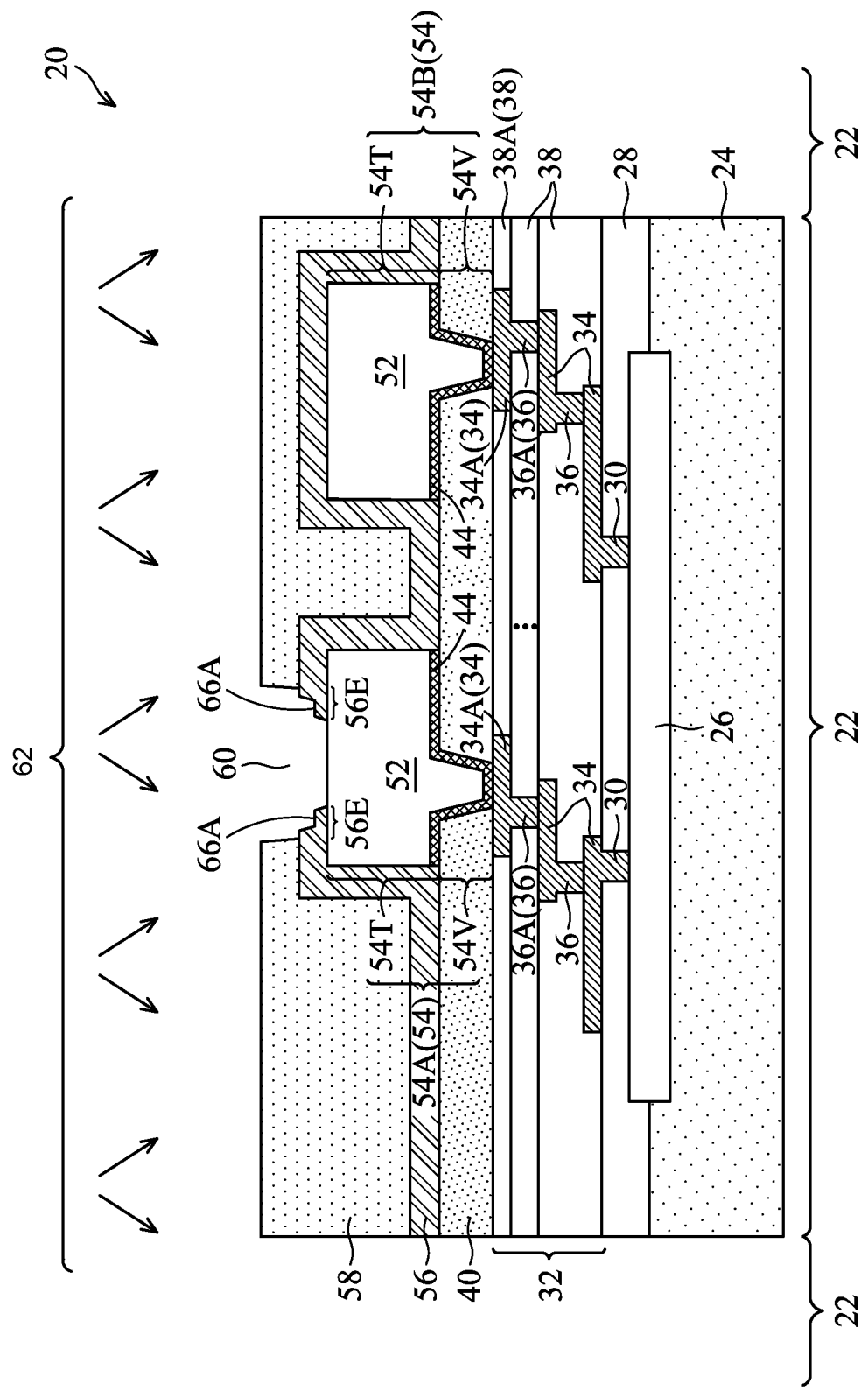

The etching process 62 is mainly an anisotropic etching process, which may be achieved by applying a low-frequency bias power, a relatively high source power and a relatively high argon flow rate, which power and the flow rate are higher compared to the subsequently performed etching process 64 (as shown in FIG. 11). In accordance with some embodiments, the frequency of the low-frequency power (bias power) is in the range between about 0.3 MHz and about 3 MHz. The relatively high source power may be smaller than about 1,800 watts. With the relatively high low-frequency source power and the relatively high argon flow rate, anisotropic etching is achieved, while at the same time, planarization layer 58 is laterally etched (faster than the lateral etching of passivation layer 56, which may be or may not be etched laterally) by the reactive gases in the process gas. Accordingly, some portions of passivation layer 56 extend beyond the corresponding edges of planarization layer 58 to form extension portions 56B. A high-frequency RF power source may also be provided in addition to the low-frequency power, with the power being in the range between about 300 watts and about 1,500 watts. The high-frequency RF power may have a frequency in the range between about 3 MHz and about 30 MHz.

Referring to FIG. 11, etching process 64 is performed to form a step in passivation layer 56. The respective process is illustrated as process 220 in the process flow 200 as shown in FIG. 27. The etching process 64 may be mainly isotropic, and may, or may not, include some anisotropic effect. With the anisotropic effect combined with the isotropic etching effect, the vertical etching rate may be greater than or equal to the horizontal etching rate. The isotropic etching process may be achieved using a high-frequency power source, with a relatively low power and a lower argon flow rate. In accordance with some embodiments, the frequency of the high-frequency power source is in the range between about 3 MHz and about 30 MHz, and may be equal to or different from the high-frequency of the power used in etching process 62. The source power used by etching process 64 is lower than the source power used in etching process 62, and may be in the range between about 50 watts and about 700 watts. In some embodiments, no bias power is provided. With the use of relatively high-frequency power source, relatively low power, and the relatively low argon flow rate, isotropic etching is achieved, as schematically illustrated in FIG. 11.

Figure 26:
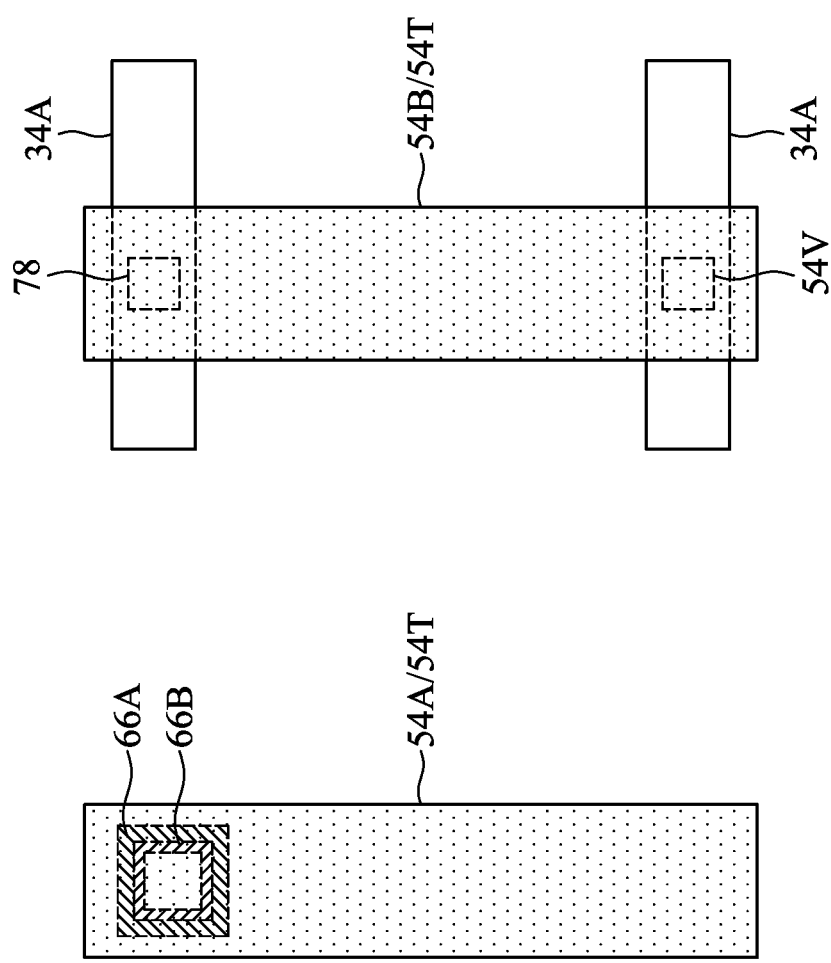
FIG. 26 illustrates the top view of two redistribution lines in accordance with some embodiments.

Due to the vertical component of the isotropic etching, the extension portions 56E are etched, with their top surfaces 56TS (FIG. 10) lowered to form steps 66A (FIG. 11), which are the lowered top surface of passivation layer 56. In a top view, steps 66A are portions of a step ring as shown in FIG. 26. In the meantime, the isotropic etching further has a lateral component, which may result in the further lateral recessing of planarization layer 58. The etching may cause planarization layer 58 to have edges laterally recessed more than the inner ends of step 66A (as shown in FIG. 11), or may be flush with the corresponding inner ends of step 66A.

Figure 12:
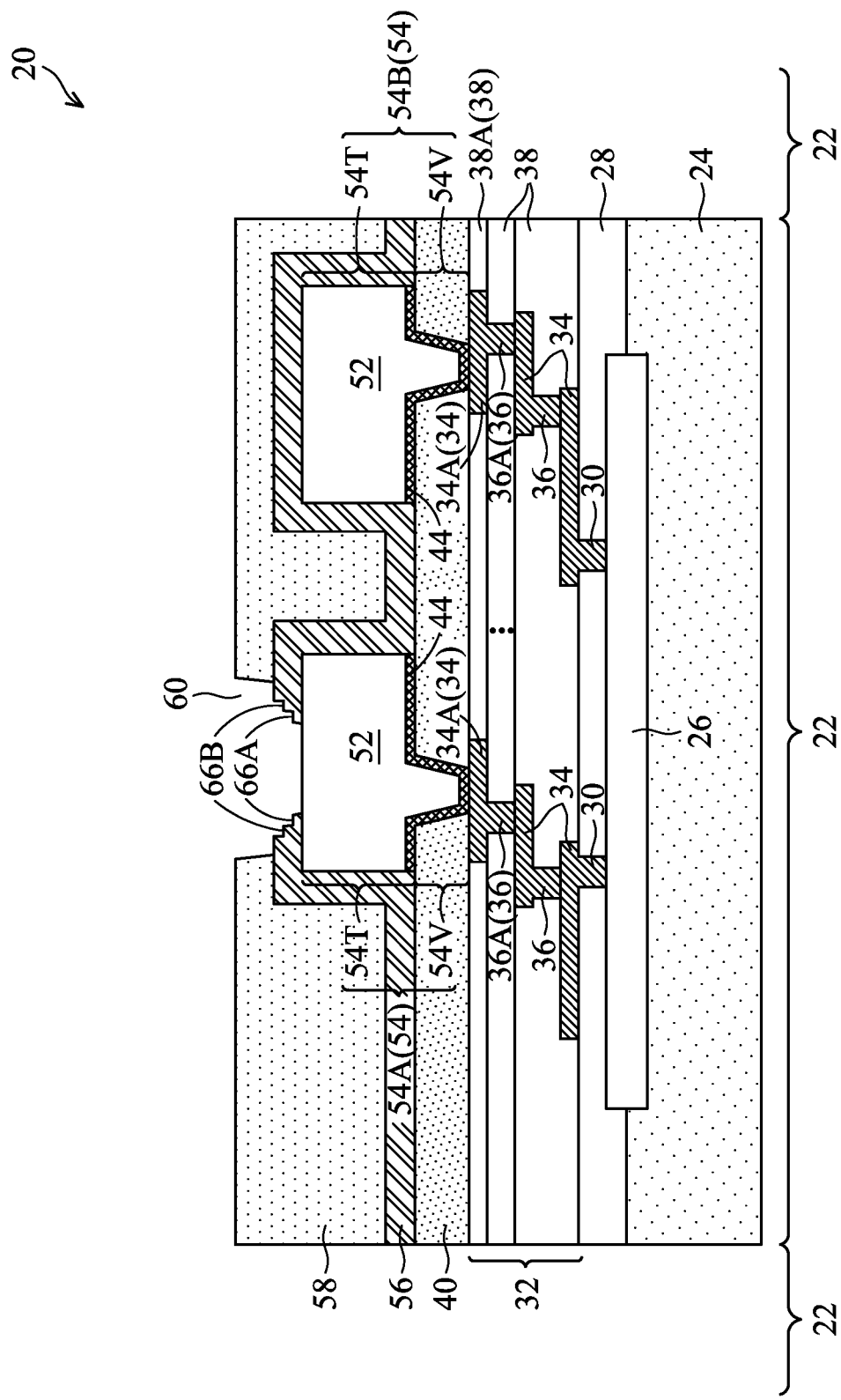

Throughout the description, the etching processes 62 and 64 are in combination referred to as an etching cycle. The etching process 62 as shown in FIG. 10 may be mainly anisotropic in the etching of passivation layer 56 (while being isotropic for planarization layer 58), and hence is referred to as a first anisotropic etching process. The etching process 64 as shown in FIG. 11 may be mainly isotropic for etching passivation layer 56 (while also being isotropic for planarization layer 58), and hence is referred to as a first isotropic etching process. Next, as shown in FIG. 12, a second step 66B is formed. The respective process is illustrated as process 222 in the process flow 200 as shown in FIG. 27. In accordance with some embodiments, the second step 66B is formed by a second etching cycle, which includes a second anisotropic etching process followed by a second isotropic etching process. The process conditions of the second anisotropic etching process and the process conditions of the second isotropic etching process may be similar to the first etching process 62 and the first etching process 64, respectively. In the second anisotropic etching process, planarization layer 58 is laterally recessed, so that more top surfaces of passivation layer 56 are revealed. In the meanwhile, step 66A is lowed in height. In the second isotropic etching process, the exposed portions of passivation layer 56 that are newly exposed due to the lateral recessing of planarization layer 58 are etched, forming a second step 66B, as shown in FIG. 12. In the second isotropic etching process, the level of the first step 66A is further lowered. Accordingly, a two-step passivation layer 56 is formed. In accordance with some other embodiments, more steps (such as three steps, four steps, or more) can be formed. The formation process may include more cycles as discussed, with each of the cycles resulting in one more step, and the deepening of the preceding steps.

The profile of steps 66A and 66B may be adjusted through the adjustment of the anisotropic etching process and the isotropic etching process. For example, increasing the time of the anisotropic etching process may result in the increase in the widths of the steps, while increasing the time of the isotropic etching process may lower the corresponding step (and the steps formed previously) more.

In accordance with alternative embodiments, the formation of step 66A may include the following processes. Planarization layer 58 is first formed and patterned, forming the structure shown in FIG. 9. A first anisotropic process is performed to etch-through passivation layer 56 using a process gas attacking passivation layer 56. As a result of the first anisotropic etching process, the sidewalls of passivation layer 56 facing opening 60 are flushed with the sidewalls of planarization layer 58.

Next, a first isotropic etching process is performed using a process gas attacking planarization layer 58, but not passivation layer 56. Due to the isotropic etching process, the sidewalls of planarization layer 58 facing opening 60 is laterally recessed, so that more top surfaces of passivation layer 56 previously covered by planarization layer 58 are exposed.

A second anisotropic etching process is then performed, for example, using a process gas that attacks passivation layer 56, but does not etch planarization layer 58 laterally. In the second anisotropic etching process, the top surface of the exposed passivation layer 56 reduces in height, forming steps 66A.

If more steps (such as steps 66B) are to be formed, the cycle including the above-discussed first isotropic etching process and the second anisotropic etching process can be repeated. Throughout the description, the first isotropic etching process and the second anisotropic etching process are in combination referred to as an etching cycle, and each of the etching cycles forms an additional step, as shown in FIG. 12.

Figure 13:
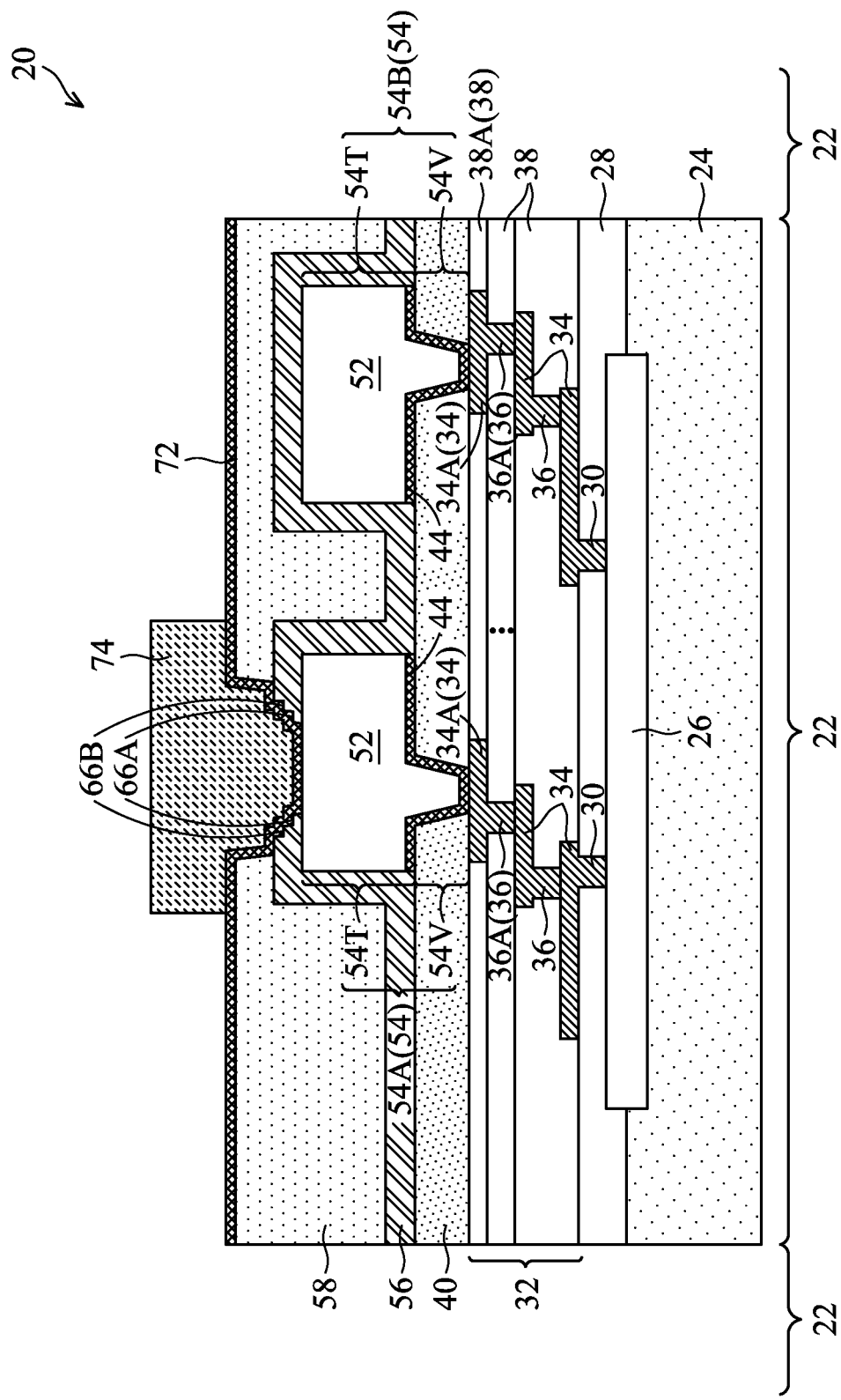

FIG. 13 illustrates the deposition of metal seed layer 72. The respective process is illustrated as process 224 in the process flow 200 as shown in FIG. 27. In accordance with some embodiments, metal seed layer 72 includes a titanium layer and a copper layer over the titanium layer. In accordance with alternative embodiments, metal seed layer 72 comprises a copper layer in contact with planarization layer 58, passivation layer 56, and the top surface of RDL 54A.

Next, conductive region 74 is plated. The respective process is illustrated as process 226 in the process flow 200 as shown in FIG. 27. The process for plating conductive region 74 may include forming a patterned plating mask (for example, a photo resist, not shown), and plating conductive region 74 in an opening in the plating mask. Conductive region 74 may comprise copper, nickel, palladium, aluminum, lead-free solder, alloys thereof, and/or multi-layers thereof. The plating mask is then removed.

Figure 14:
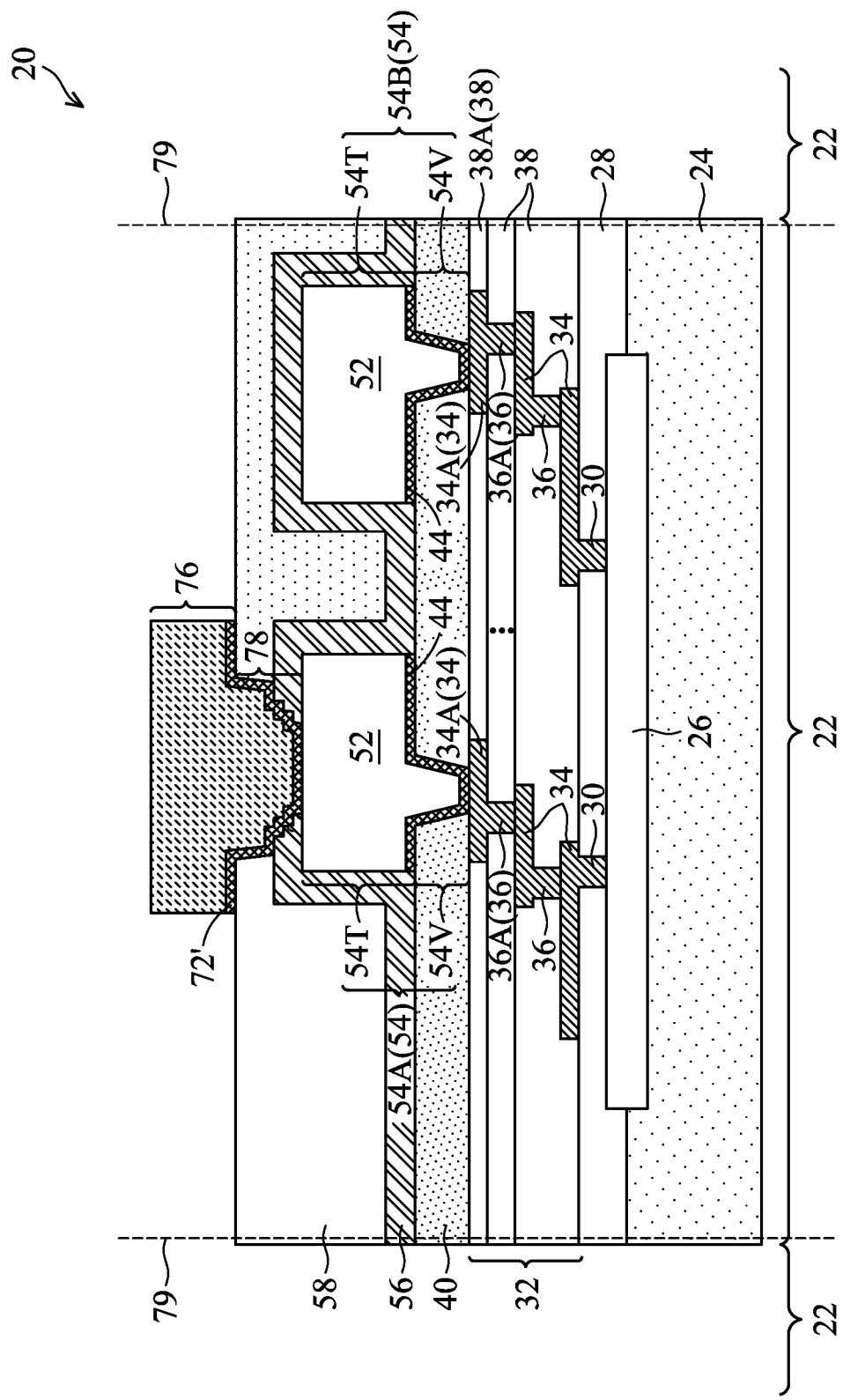

Metal seed layer 72 is then etched, and the portions of metal seed layer 72 that are exposed after the removal of the plating mask are removed, while the portions of metal seed layer 72 directly underlying conductive region 74 are left. The respective process is illustrated as process 228 in the process flow 200 as shown in FIG. 27. The resulting structure is shown in FIG. 14. A remaining portion of metal seed layer 72 is an Under-Bump Metallurgy (UBM) 72'. UBM 72' and conductive region 74 in combination form via 78 and electrical connector 76 (which is also referred to as a bump).

In a subsequent process, wafer 20 is singulated, for example, sawed along scribe lines 79 to form individual device dies 22. The respective process is illustrated as process 230 in the process flow 200 as shown in FIG. 27. Device dies 22 are also referred to as devices 22 or package components 22 since devices 22 may be used for bonding to other package components in order to form packages. As aforementioned, devices 22 may be device dies, interposers, package substrate, packages, or the like.

Figure 15:
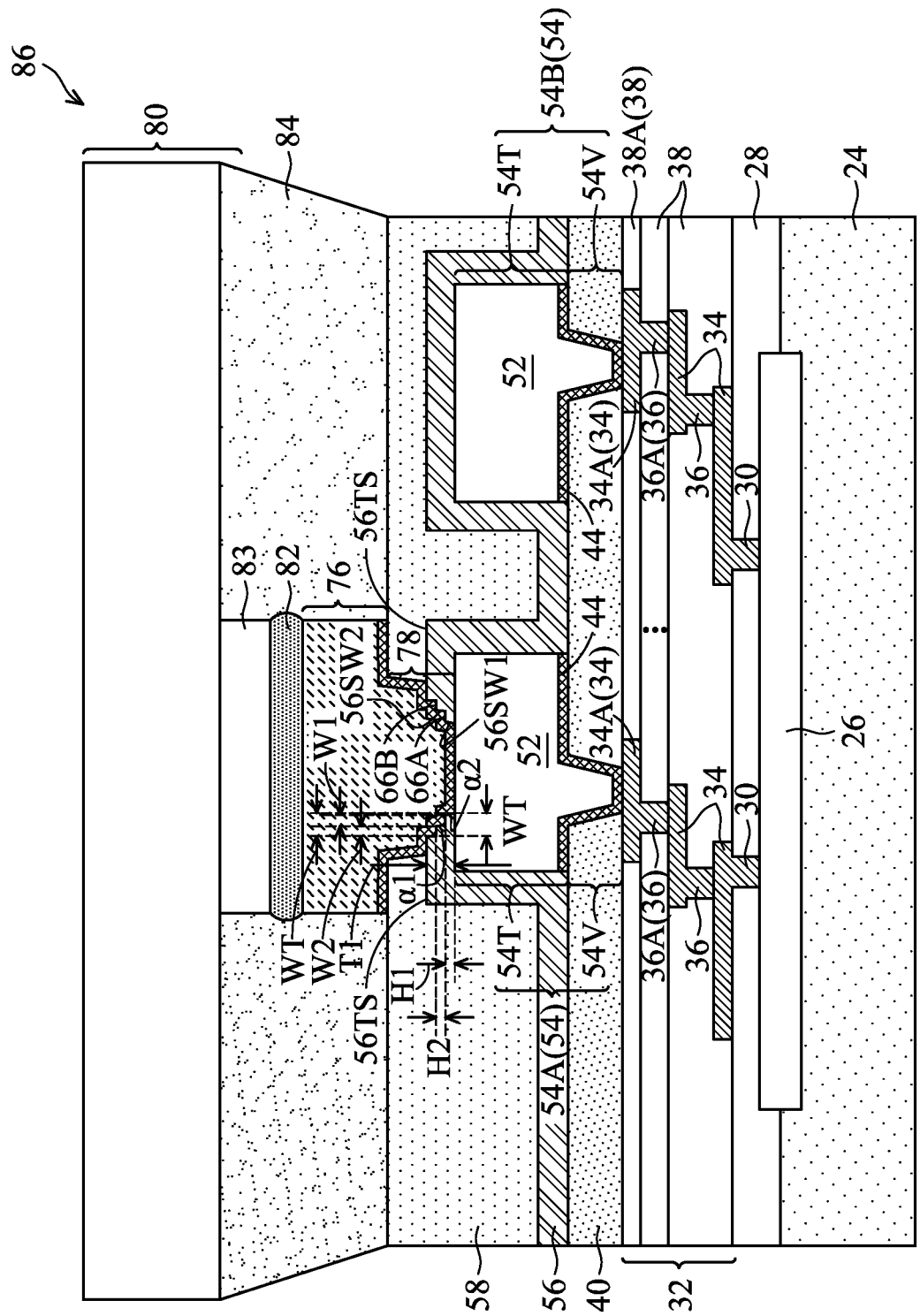

Referring to FIG. 15, device 22 is bonded with package component 80 to form package 86. The respective process is illustrated as process 232 in the process flow 200 as shown in FIG. 27. In accordance with some embodiments, package component 80 is or comprises an interposer, a package substrate, a printed circuit board, a package, or the like. Electrical connector 83 in package component 80 may be bonded to package component 80 through solder region 82. Underfill 84 is dispensed between device 22 and package component 80.

A magnified view of steps is illustrated on a side of package 86. In accordance with some embodiments, the thickness T1 of the portions of passivation layer 56 on top of RDL 54 may be in the range between about 0.5 μm and about 1.5 μm. The widths W1 and W2 of steps 66A and 66B, respectively, may be in the range between about 0.8 μm and about 3.2 μm. The sidewall 56SW1 of step 66A and the sidewall 56SW2 of step 66B may be vertical or slanted, for example, with slant angles α1 and α2 being in the range between about 45 degrees and about 90 degrees. Angles α1 and α2 may be equal to or different from each other. Steps 66A and 66B may be planar in the cross-sectional view, and may be leveled or slightly slanted. Sidewalls 56SW1 and 56SW2 may be straight, and may be vertical or slanted. The heights H1 and H2 of each of steps 66A and 66B may be in the range between about ⅕ and about ½ of thickness T1. The ratio of H1/H2 may be in the range between about ½ and about 2.0. Each of ratios W1/WT and W2/WT may be in the range between about ¼ and about ½, wherein with WT is the total width of steps 66A and 66B. Furthermore, the steps may have a symmetric profile or an asymmetric profile, for example, with angles α1 and α2 being the same as, or different from, each other, and/or height H1 and H2 being the same as, or different from, each other.

Figure 16:
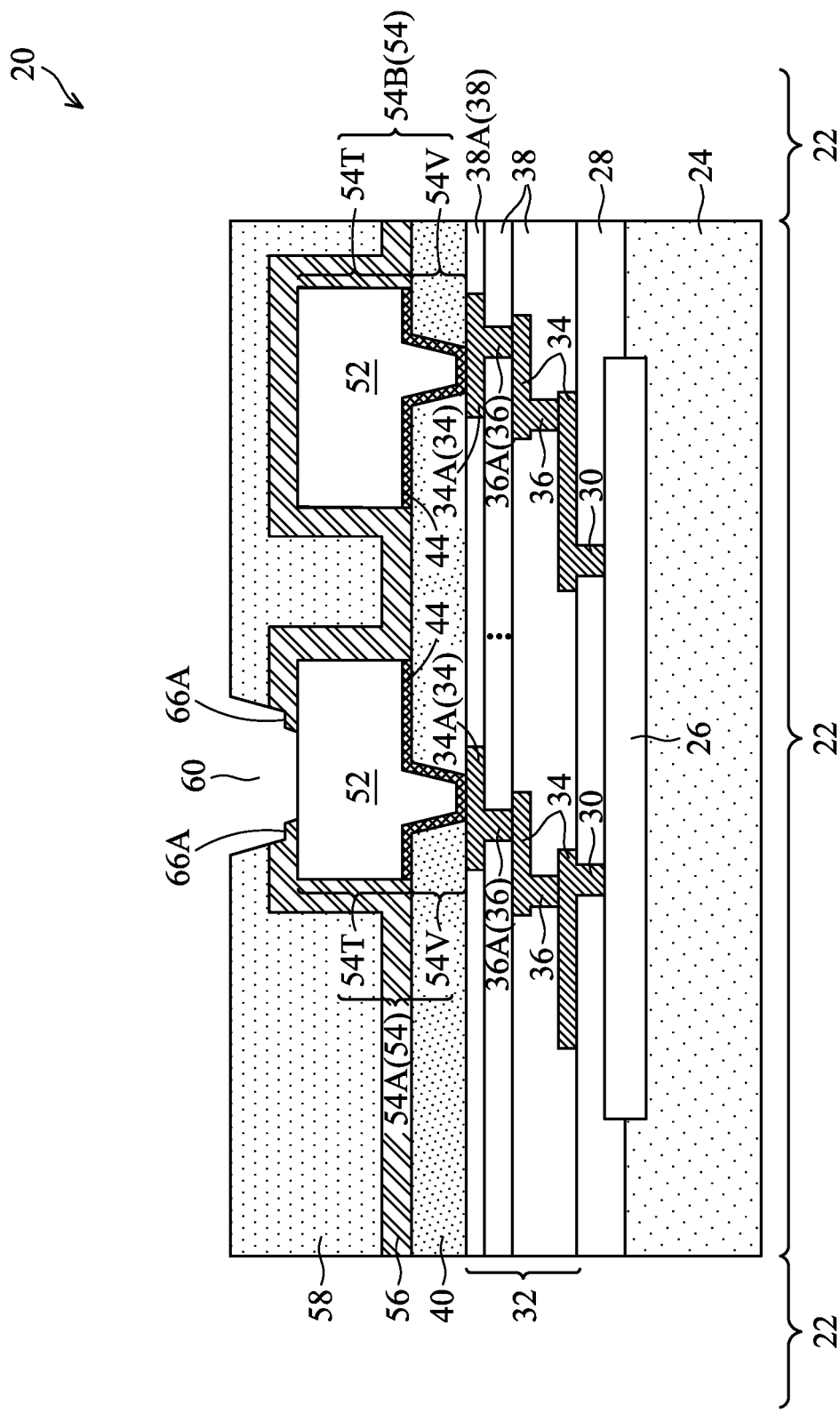
FIGS. 16-18 and 19A illustrate the cross-sectional views of intermediate stages in the formation of a package in accordance with some embodiments.
Figure 17:
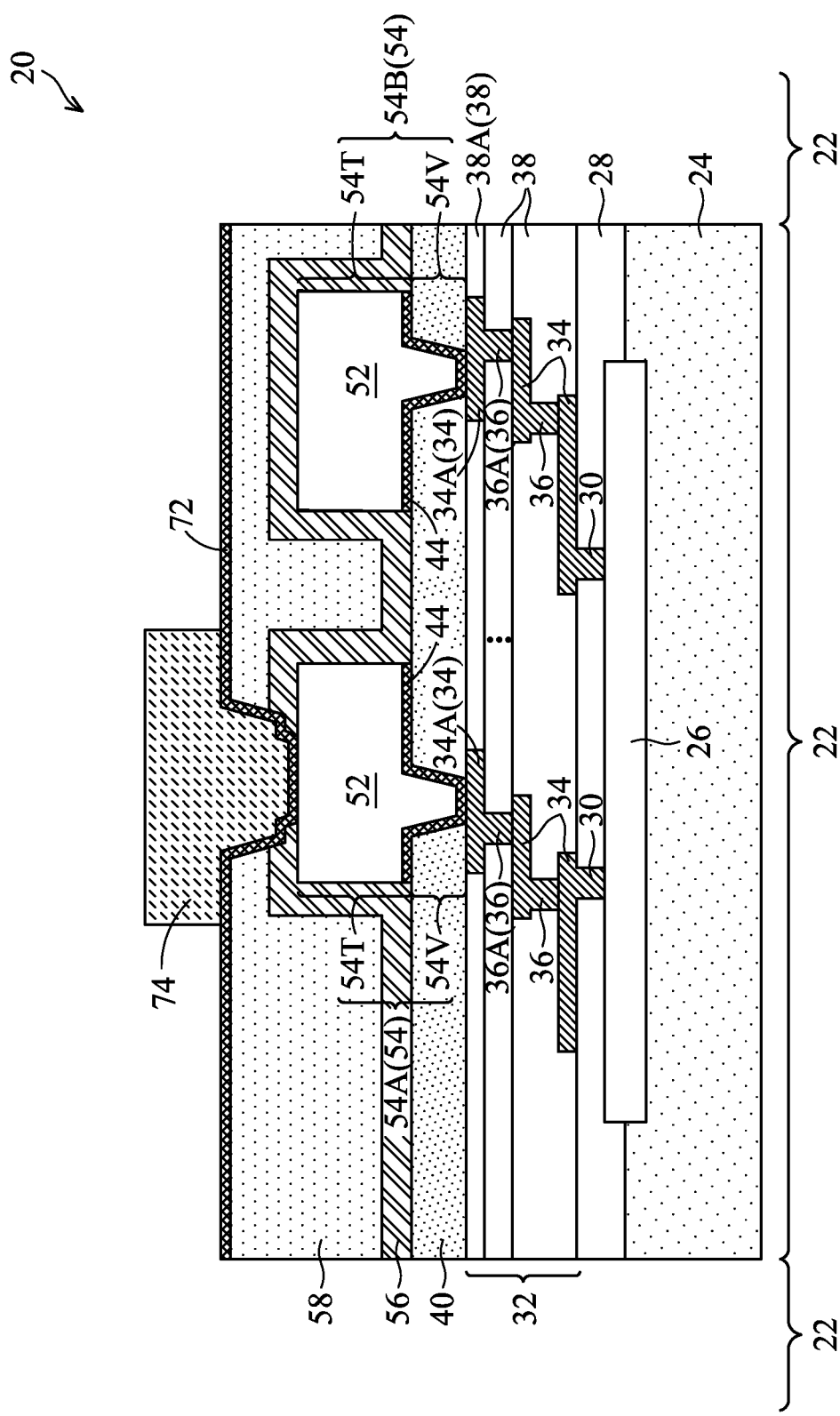
Figure 18:
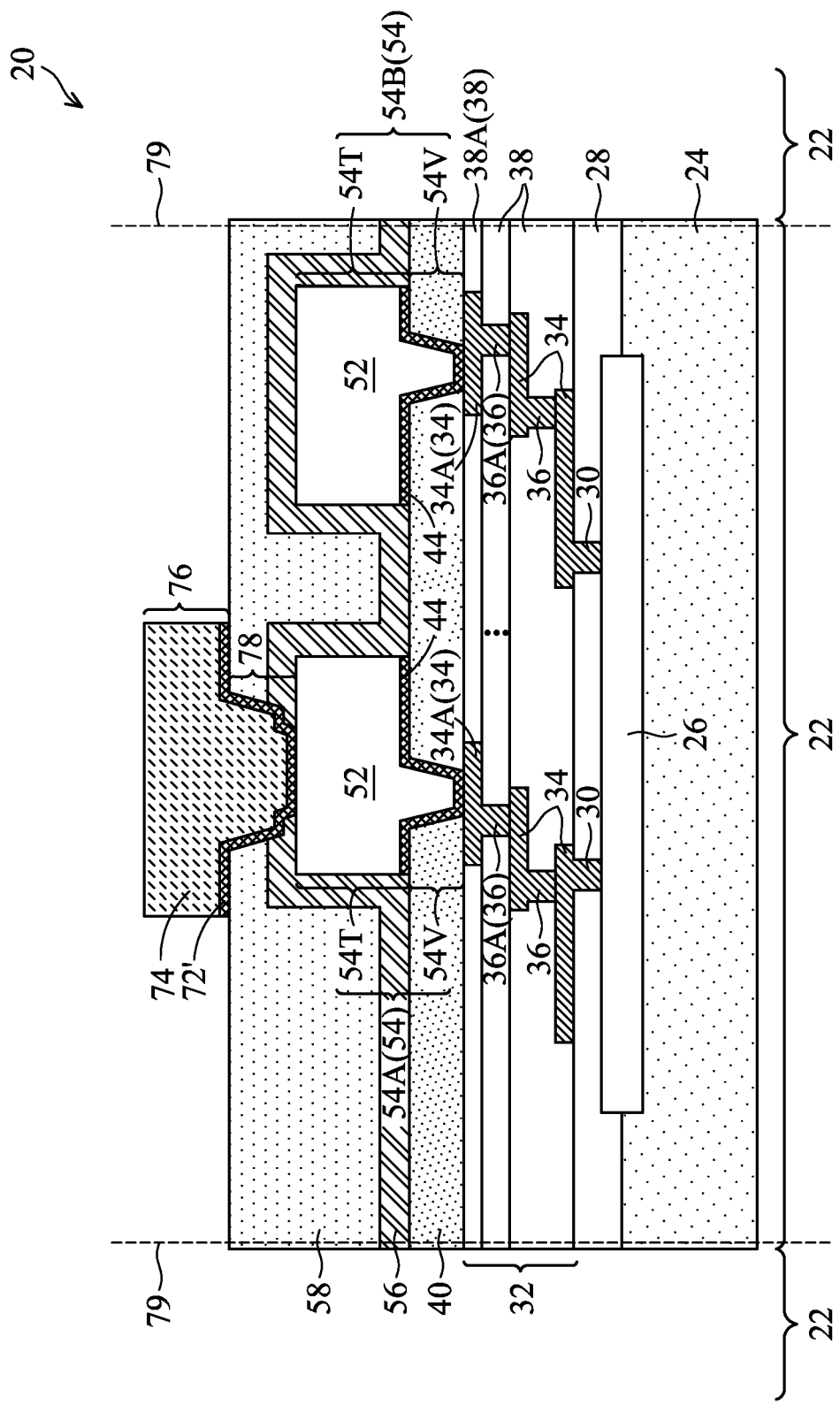
Figure 19A:
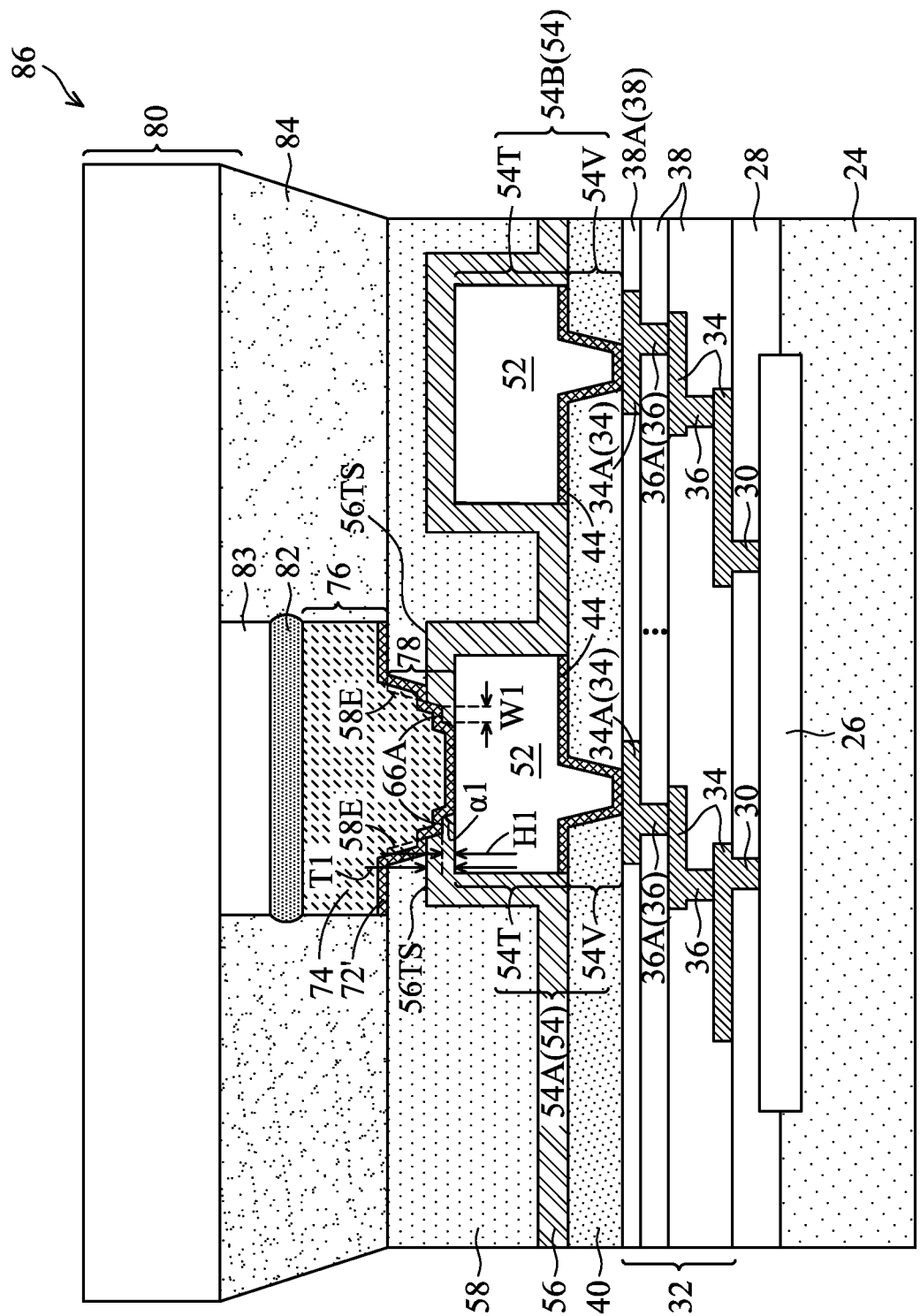

FIGS. 16-18 and 19A illustrate cross-sectional views of intermediate stages in the formation of a package in accordance with some embodiments of the present disclosure. These embodiments are similar to the embodiments shown in FIGS. 1 through 15, except that one step, instead of two steps, is formed. Unless specified otherwise, the materials and the formation processes of the components in these embodiments are essentially the same as the like components, which are denoted by like reference numerals in the preceding embodiments shown in FIGS. 1 through 15. The details regarding the formation process and the materials of the components shown in FIGS. 16-18 and 19A (and FIGS. 20 through 25) may thus be found in the discussion of the preceding embodiments. The initial steps of these embodiments are essentially the same as shown in FIGS. 1 through 11. The resulting structure is shown in FIG. 16, which is the same structure as shown in FIG. 11. FIGS. 17, 18, and 19A illustrate the formation of the remaining portions of package 86. For example, FIG. 17 illustrates the formation of metal seed layer 72 and conductive region 74. FIG. 18 illustrates the etching of metal seed layer 72 and the singulation process. FIG. 19A illustrates the bonding of device 22 to package component 80 and the dispensing of underfill 84.

In FIG. 19A, the thickness T1 of passivation layer 56 may be in the range between about 0.5 μm and about 1.5 μm. The ratio H1/T1 is smaller than 1.0, and may be in the range between about ⅓ and about ⅔. Width W1 of steps 66A may be in the range between about 0.8 μm and about 3.2 μm.

Figure 19B:
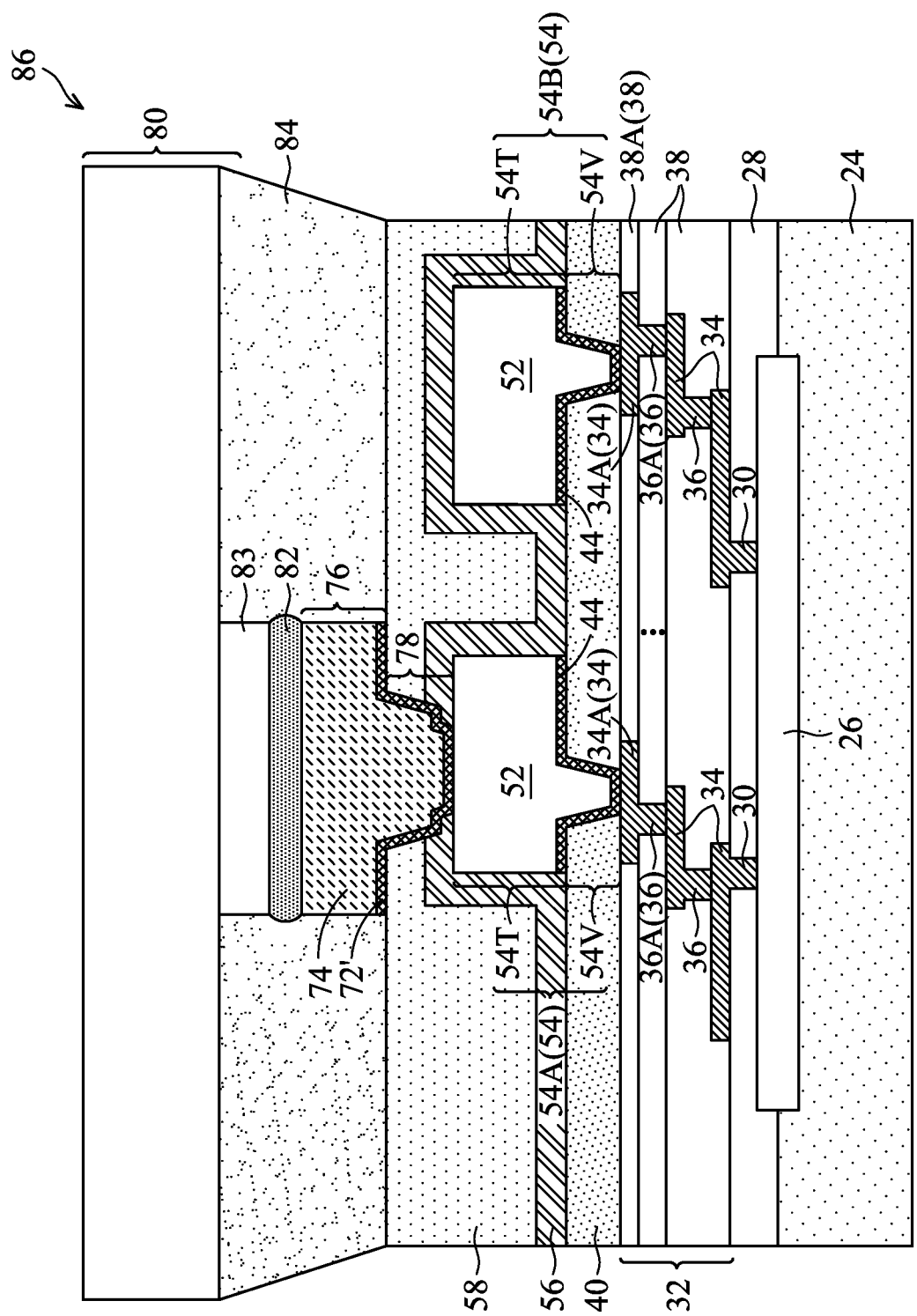
FIG. 19B illustrates the cross-sectional view of a package in accordance with some embodiments.

In FIGS. 16-18 and 19A, the edges of planarization layer 58 are recessed laterally from the sidewalls of the corresponding highest step (the step 66B in FIG. 15 and the step 66A in FIG. 19A). In accordance with alternative embodiments, the edges of planarization layer 58 may be flushed with the sidewalls of the corresponding step 66B (FIG. 15) and step 66A (FIG. 19A). The corresponding edges are illustrated using dashed lines in FIGS. 15 and 19A. The corresponding package is also shown in FIG. 19B, which also shows a cross-sectional view. The formation of the corresponding process may be achieved by reducing the isotropic etching of planarization layer 58 in the corresponding process for forming steps, or using anisotropic etching processes in the formation of the steps.

FIGS. 20 through 25 illustrate cross-sectional views of intermediate stages in the formation of a package in accordance with some embodiments of the present disclosure. These embodiments are similar to the embodiments shown in FIGS. 1 through 15, except that planarization layer extends into the opening in passivation layer 56. The initial steps of these embodiments are essentially the same as shown in FIGS. 1 through 11, except the layer 58 as shown in FIGS. 9-11 is a sacrificial layer, which is used as an etching mask. Layer 58 is thus referred to as etching mask 58 hereinafter. Etching mask 58 may also be formed of photo resist or a polymer (which may be photo-sensitive or non-photo-sensitive) such as polyimide, PBO, BCB, an epoxy, or the like.

Figure 20:
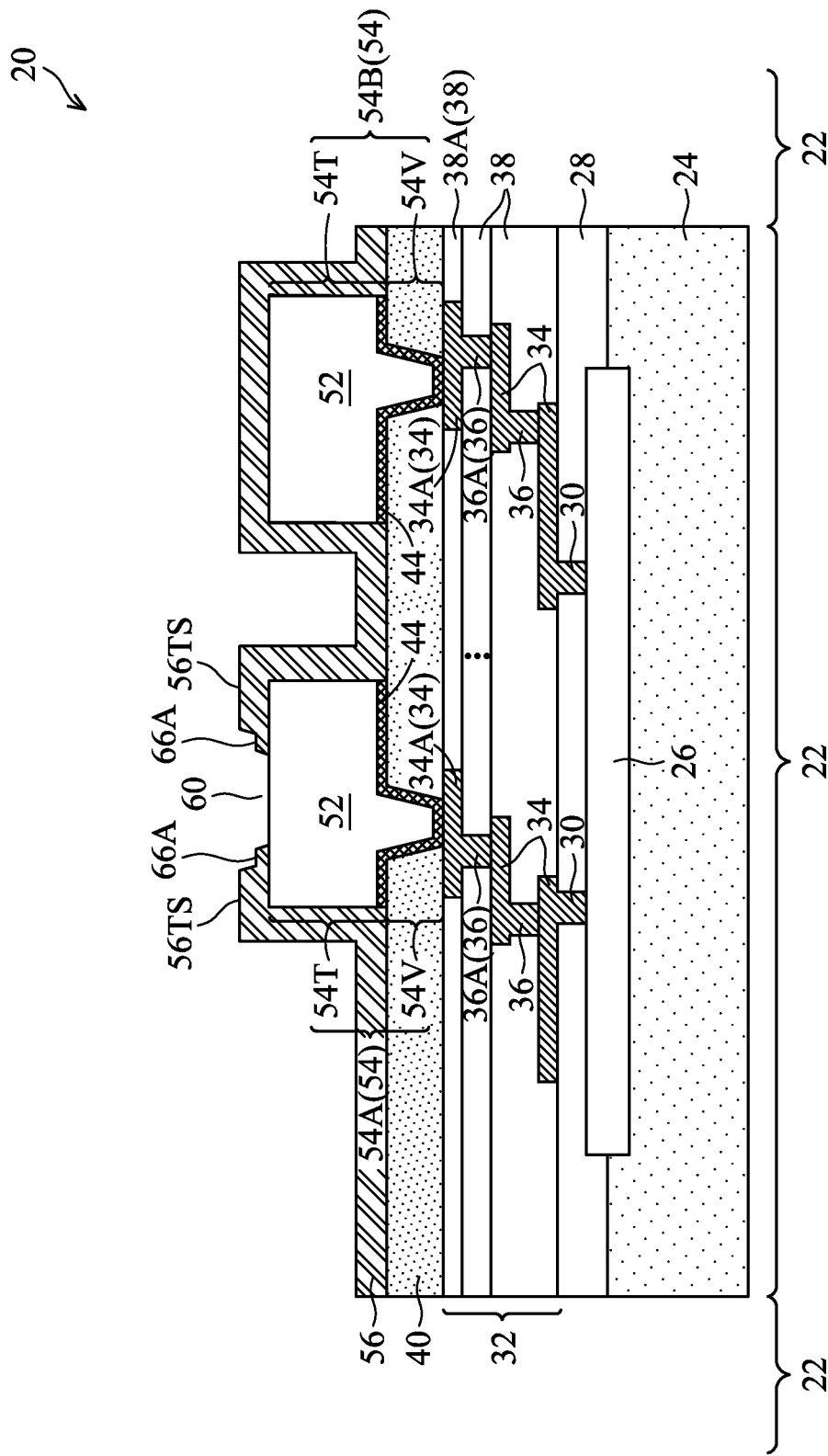
FIGS. 20 through 25 illustrate the cross-sectional views of intermediate stages in the formation of a package in accordance with some embodiments
Figure 21:
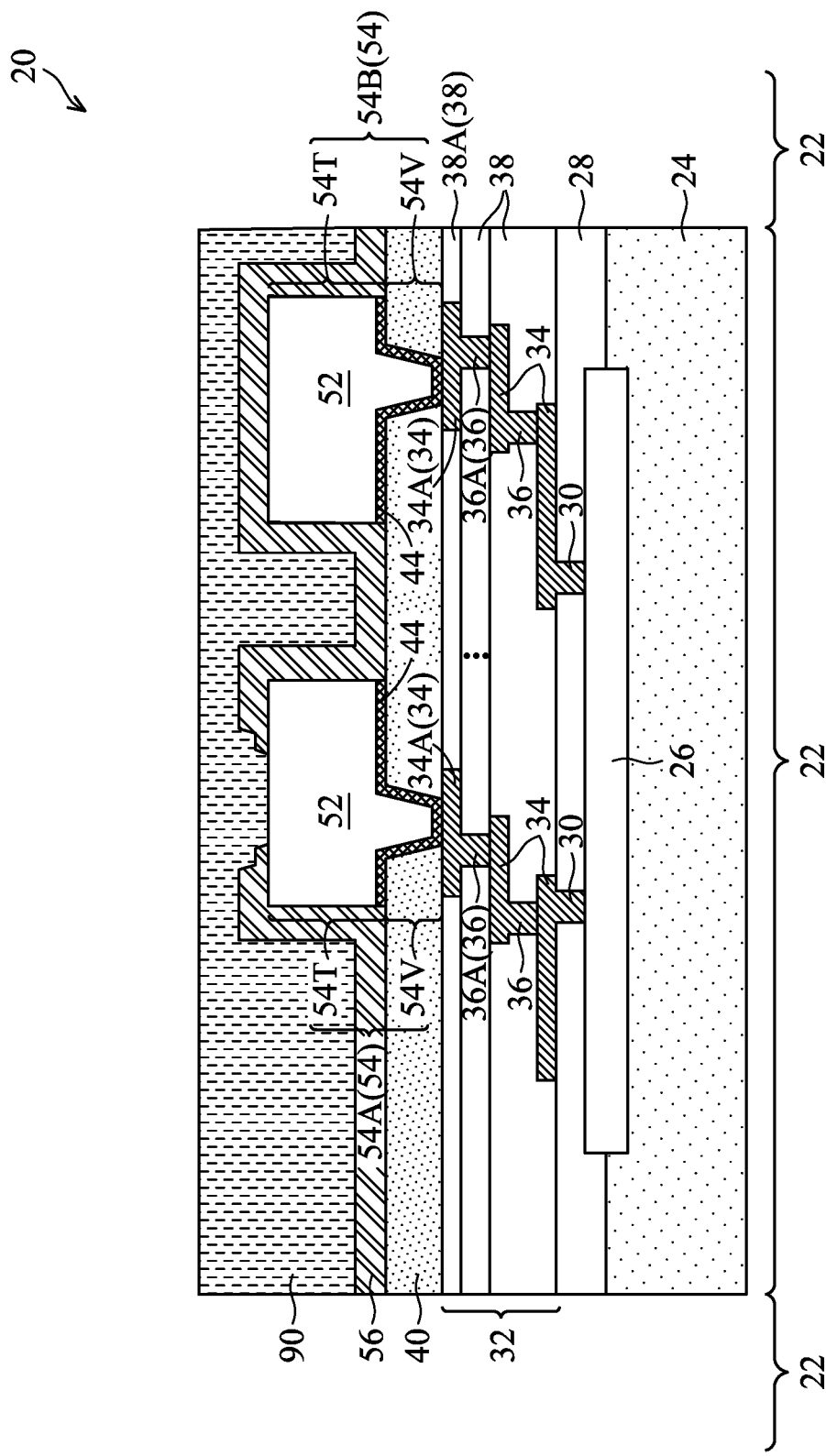

After the formation of steps 66A as shown in FIG. 11, etching mask 58 is removed, and the resulting structure is shown in FIG. 20. FIG. 21 illustrates the formation of planarization layer 90. In accordance with some embodiments of the present disclosure, planarization layer 90 is formed of a polymer (which may be photo-sensitive) such as polyimide, PBO, BCB), an epoxy, or the like. Planarization layer 90 may be formed of the same polymer as, or a different polymer than, etching mask 58 when etching mask 58 is formed of a polymer. In accordance with some embodiments, the formation of planarization layer 90 includes coating the planarization layer in a flowable form, and then performing a curing process to harden planarization layer 90. A planarization process such as a mechanical grinding process may be (or may not be) performed to level the top surface of planarization layer 90.

Figure 22:
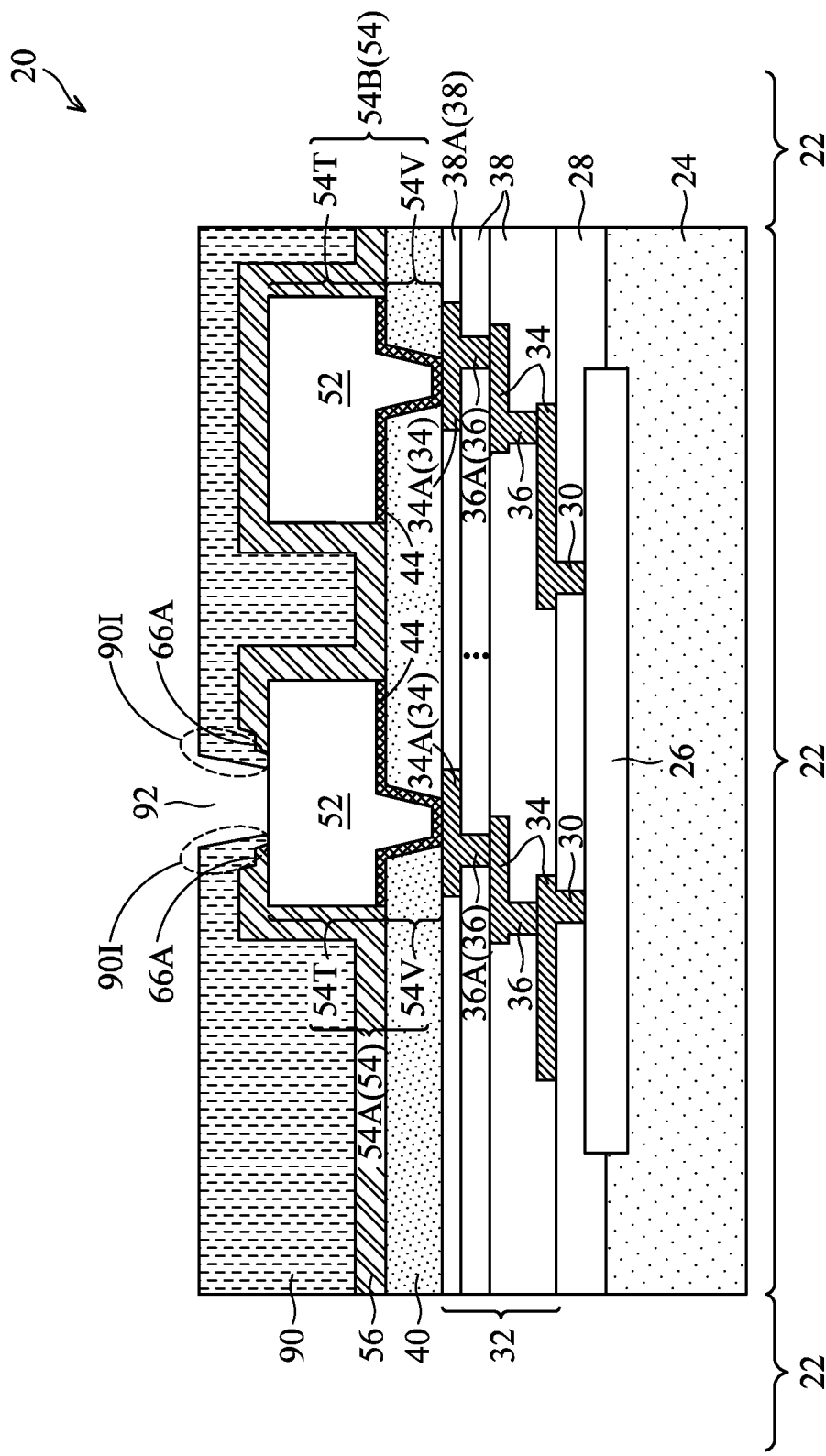
Figure 23:
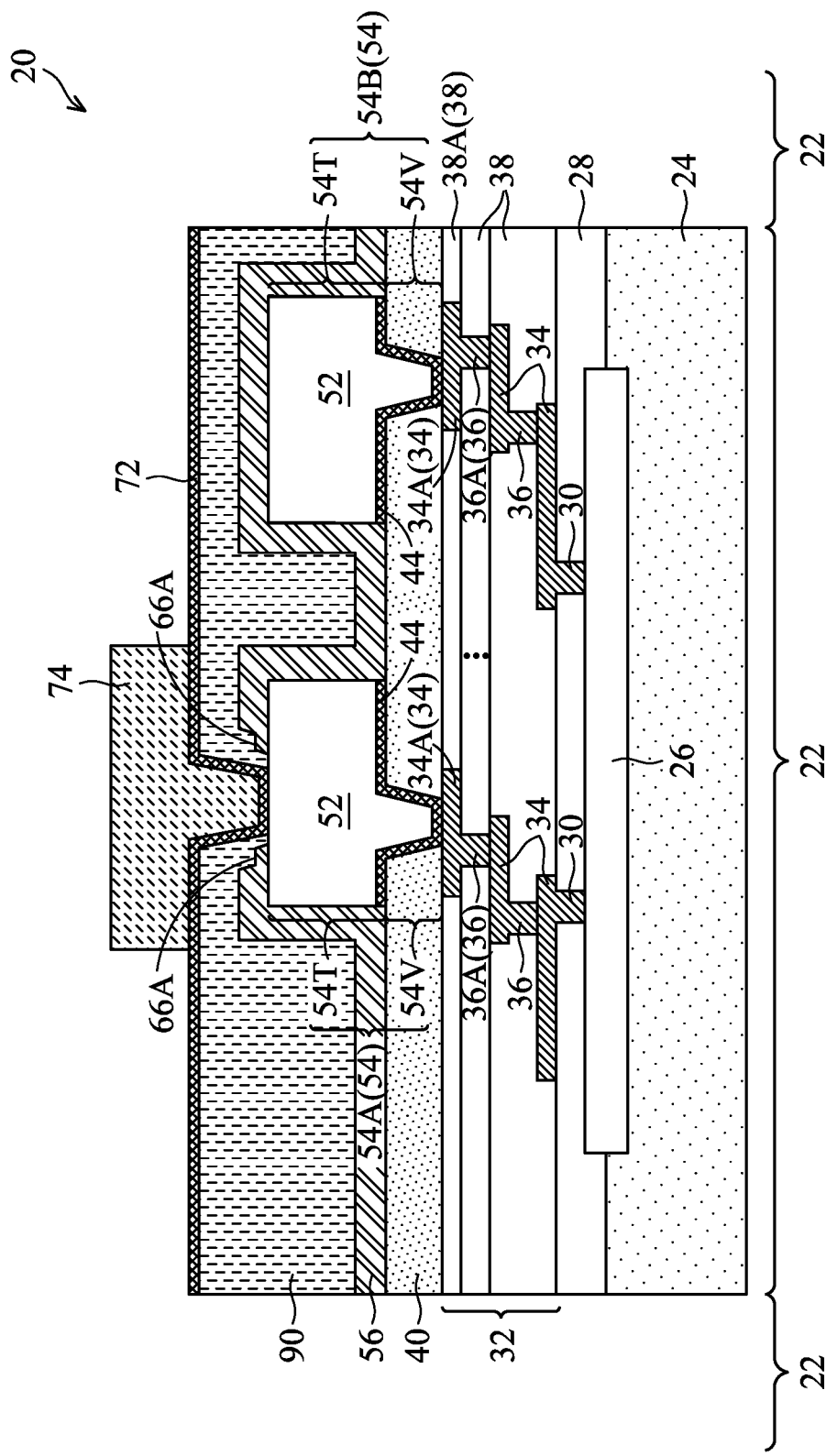
Figure 24:
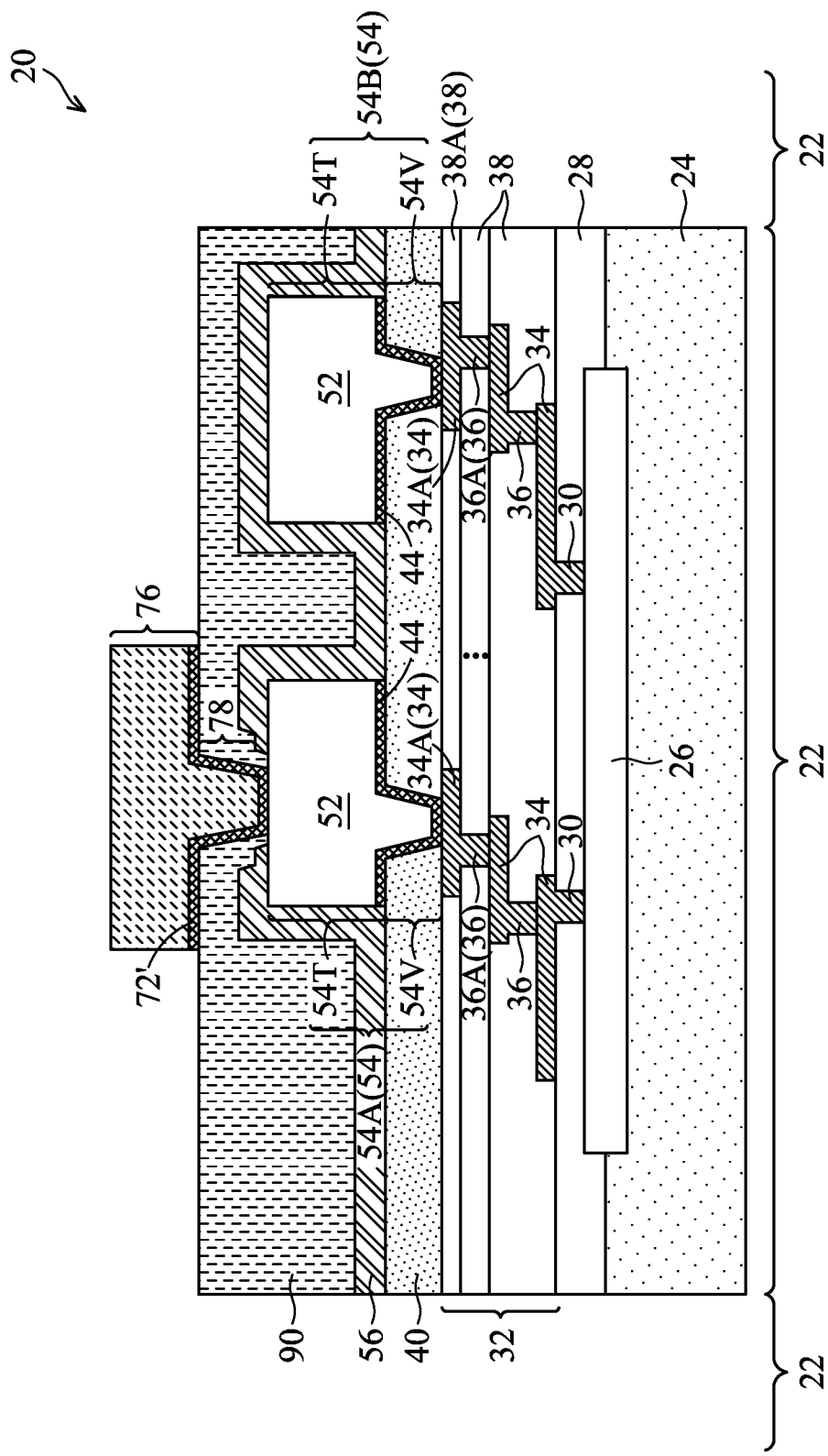
Figure 25:
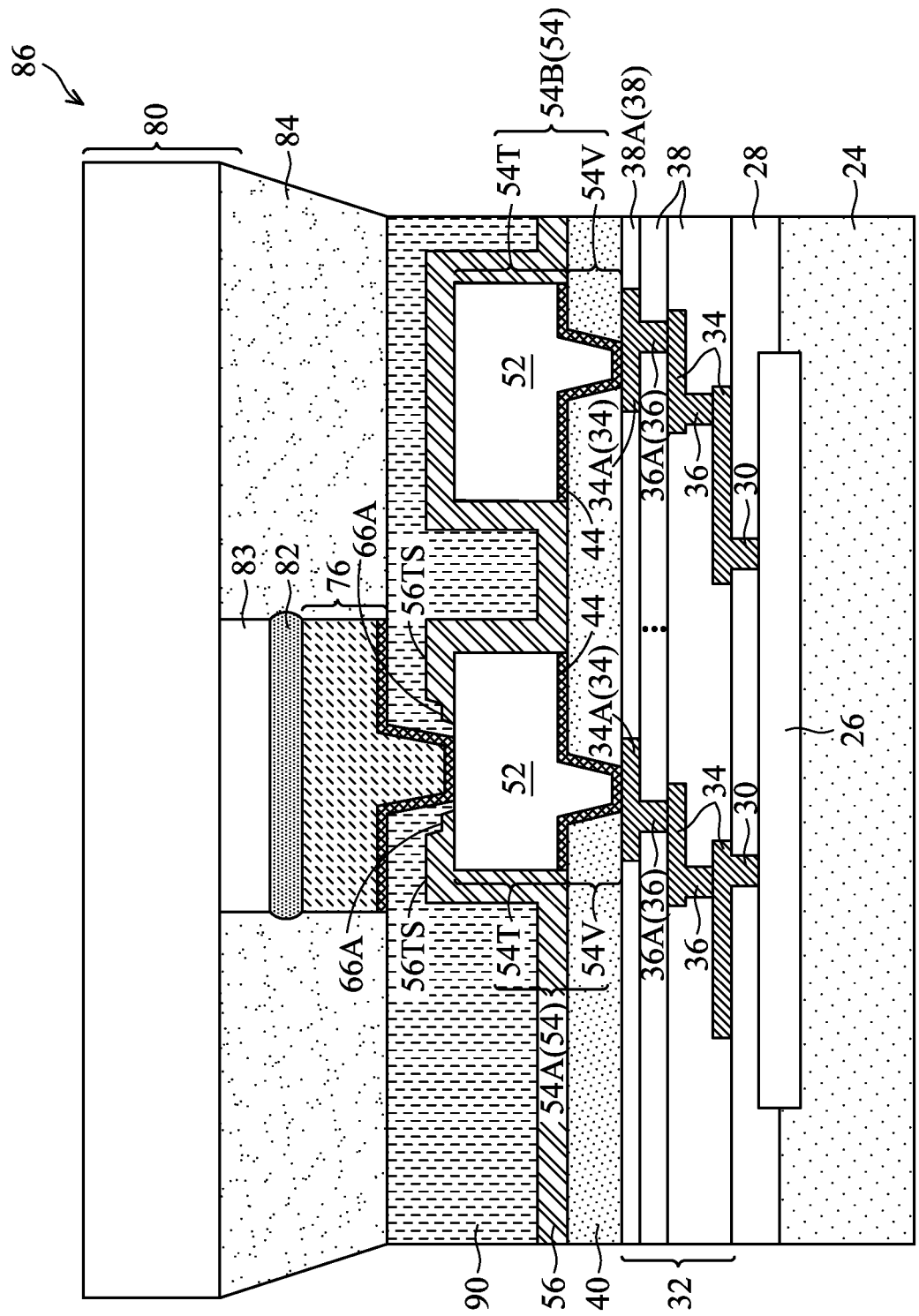

Referring to FIG. 22, planarization layer 90 is patterned, for example, through a light-exposure process followed by a development process. Opening 92 is thus formed in planarization layer 90. In accordance with some embodiments, planarization layer 90 fully covers steps 66A and the sidewalls of passivation layer 56. Accordingly, planarization layer 90 comprises portions 90I on the inner sides of the sidewalls of passivation layer 56. Portions 90I extend down to RDL 54A. The lower parts of portions 90I act as the anchors, so that planarization layer 90 is less likely to peel from passivation layer 56. The subsequent processes shown in FIGS. 23 through 25 are essentially the same as shown in FIGS. 13 through 15, and the details are not repeated herein.

FIG. 26 illustrates the top view of two RDLs, which are also denoted as RDLs 54A and 54B (FIGS. 15, 19A, 19B, and 25). In accordance with some embodiments, RDL 54A is used for electrically connecting electrical connector 76 to the underlying integrated circuit devices 26 (FIGS. 15, 19A, 19B, and 25). Step 66A and step 66B (if there are two steps) are formed as rings, with the ring of step 66B encircling the ring of step 66A in the top view. When more steps such as three steps, four steps, etc., are formed, the higher steps will form rings encircling the respective lower steps in the top view.

On the other hand, RDL 54B is not connected to any overlying electrical connector, and is used for internal electrical redistribution for electrically connecting the features inside device 22. For example, the opposing ends of RDL 54B may be connected to two of metal lines 34A (FIG. 17) through vias 54V. Alternatively stated, an entirety of RDL 54B is covered by passivation layer 56, and all sidewalls of RDL 54B may be in contact with passivation layer 56.

The embodiments of the present disclosure have some advantageous features. By forming steps, the passivation layer provides extra spots for stress distribution, which spots include the interfaces between the multiple top surfaces and multiple sidewalls contacting with the overlying feature such as the UBM or the planarization layer. Accordingly, the stepped passivation layer has increased resistance to delamination, which delamination may be at the interfaces between passivation layers 40 and 56, the interfaces between passivation layer 56 and planarization layer 58, and the interfaces between passivation layer 56 and RDL 54A.

In accordance with some embodiments of the present disclosure, a method comprises forming a first conductive feature; depositing a passivation layer on a sidewall and a top surface of the first conductive feature; etching the passivation layer to reveal the first conductive feature; recessing a first top surface of the passivation layer to form a first step, wherein the first step comprises a second top surface of the passivation layer; forming a planarization layer on the passivation layer; and forming a second conductive feature extending into the passivation layer to contact the first conductive feature. In an embodiment, the method further comprises recessing the first top surface of the passivation layer to form a second step higher than the first step. In an embodiment, the forming the first step is performed when the planarization layer is located on the passivation layer. In an embodiment, the forming the first step comprises laterally recessing the planarization layer; and after the planarization layer is laterally recessed, etching the passivation layer using the laterally recessed planarization layer as an etching mask. In an embodiment, the forming the first step comprises performing a first etching process; and performing a second etching process, wherein the first etching process and the second etching process are performed using different process conditions. In an embodiment, the method further comprises forming a patterned etching mask, wherein the passivation layer is etched using the patterned etching mask to define patterns; and before the forming the planarization layer removing the patterned etching mask. In an embodiment, the forming the planarization layer comprises dispensing the planarization layer; and performing a planarization process on the planarization layer.

In accordance with some embodiments of the present disclosure, a device comprises a redistribution line; a passivation layer comprising: sidewall portions extending on sidewalls of the redistribution line; and a first top portion over and contacting the redistribution line, wherein the first top portion comprises a first top surface, a second top surface higher than the first top surface, and a sidewall connecting the first top surface to the second top surface; a planarization layer comprising a second top portion over and contacting the second top surface of the first top portion of the passivation layer, wherein the planarization layer further contacts the sidewall portions of the passivation layer; and a second conductive feature extending into both of the first top portion and the second top portion to contact the redistribution line. In an embodiment, the first top surface and the second top surface are planar. In an embodiment, the first top surface and the second top surface are vertically spaced apart from an additional top surface of the redistribution line by a first distance and a second distance, respectively, and a ratio of the first distance to the second distance is in a range between about ⅕ and about ½. In an embodiment, the second conductive feature physically contacts the first top surface. In an embodiment, the second conductive feature is physically separated from the first top surface and the second top surface by the planarization layer. In an embodiment, the first top portion of the passivation layer further comprises a third top surface lower than the first top surface, wherein each of the first top surface and the third top surface forms a step. In an embodiment, each of the first top surface, the second top surface, and the third top surface is planar. In an embodiment, the planarization layer comprises a first sidewall, and the second top surface extends to a second sidewall of the passivation layer, and wherein the first sidewall is offset from the second sidewall. In an embodiment, the planarization layer comprises a first sidewall, and the second top surface extends to a second sidewall of the passivation layer, and wherein the first sidewall is flush with the second sidewall.

In accordance with some embodiments of the present disclosure, a device comprises a passivation layer; a first conductive feature comprising a portion over the passivation layer; a first dielectric layer comprising a top portion over and contacting the first conductive feature, wherein the first dielectric layer comprises a first top surface; a first sidewall connecting the first top surface to an additional top surface of the first conductive feature; a second top surface higher than the first top surface; and a second sidewall connecting the second top surface to the first top surface; a second dielectric layer comprising an additional top portion over and contacting the top portion of the first dielectric layer; an Under-Bump Metallurgy (UBM) extending into the additional top portion of the second dielectric layer and the top portion of the first dielectric layer; and a solder region over and contacting the UBM. In an embodiment, the top portion of the first dielectric layer further comprises a third top surface higher than the second top surface; and a third sidewall connecting the third top surface to the second top surface. In an embodiment, the UBM contacts both of the first top surface and the second top surface. In an embodiment, the UBM is physically separated from both of the first top surface and the second top surface by a portion of the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first conductive feature;
    depositing a passivation layer on a sidewall and a top surface of the first conductive feature;
    forming a planarization layer on the passivation layer;
    etching the planarization layer and the passivation layer to reveal the first conductive feature;
    recessing a first top surface of the passivation layer to form a first step, wherein the first step is formed when the planarization layer is located on the passivation layer, and wherein the first step comprises a second top surface of the passivation layer; and
    forming a second conductive feature extending into the passivation layer to contact the first conductive feature.

2. The method of claim 1 further comprising recessing the first top surface of the passivation layer to form a second step higher than the first step.

3. The method of claim 1, wherein the forming the first step comprises:
    laterally recessing the planarization layer; and
    after the planarization layer is laterally recessed, etching the passivation layer using the laterally recessed planarization layer as an etching mask.

4. The method of claim 1, wherein the forming the first step comprises:
    performing a first etching process; and
    performing a second etching process, wherein the first etching process and the second etching process are performed using different process conditions.

5. The method of claim 1 further comprising forming a patterned etching mask, wherein the passivation layer is etched using the patterned etching mask to define patterns; and
    before the forming the planarization layer removing the patterned etching mask.

6. The method of claim 1, wherein the forming the planarization layer comprises:
    dispensing the planarization layer; and
    performing a planarization process on the planarization layer.

7. A device comprising:
    a redistribution line;
    a passivation layer comprising:
        sidewall portions extending on sidewalls of the redistribution line; and
        a first top portion over and contacting the redistribution line, wherein the first top portion comprises:
            a first top surface;
            a second top surface higher than the first top surface;
            a sidewall connecting the first top surface to the second top surface; and
            a third top surface lower than the first top surface, wherein each of the first top surface and the third top surface forms a part of a step;
    a planarization layer comprising a second top portion over and contacting the second top surface of the first top portion of the passivation layer, wherein the planarization layer further contacts the sidewall portions of the passivation layer; and
    a conductive feature extending into both of the first top portion and the second top portion to contact the redistribution line.

8. The device of claim 7, wherein the first top surface and the second top surface are planar.

9. The device of claim 7, wherein the first top surface and the second top surface are vertically spaced apart from an additional top surface of the redistribution line by a first distance and a second distance, respectively, and a ratio of the first distance to the second distance is in a range between about ⅕ and about ½.

10. The device of claim 7, wherein the conductive feature physically contacts the first top surface.

11. The device of claim 7, wherein the conductive feature is physically separated from the first top surface and the second top surface by the planarization layer.

12. The device of claim 7, wherein each of the first top surface, the second top surface, and the third top surface is planar.

13. The device of claim 7, wherein the planarization layer comprises a first sidewall, and the second top surface extends to a second sidewall of the passivation layer, and wherein the first sidewall is offset from the second sidewall.

14. The device of claim 7, wherein the planarization layer comprises a first sidewall, and the second top surface extends to a second sidewall of the passivation layer, and wherein the first sidewall is flush with the second sidewall.

15. A device comprising:
    a passivation layer;
    a first conductive feature comprising a portion over the passivation layer;
    a first dielectric layer comprising:
        a top portion over and contacting the first conductive feature, wherein the first dielectric layer comprises:
            a first top surface;
            a first sidewall connecting the first top surface to an additional top surface of the first conductive feature;
            a second top surface higher than the first top surface; and
            a second sidewall connecting the second top surface to the first top surface; and
        a sidewall portion vertically offset from the first conductive feature, wherein the sidewall portion comprises a first additional top surface lower than a second additional top surface of the first conductive feature;
    a second dielectric layer comprising an additional top portion over and contacting the top portion of the first dielectric layer;
    an Under-Bump Metallurgy (UBM) extending into the additional top portion of the second dielectric layer and the top portion of the first dielectric layer; and
    a solder region over and contacting the UBM.

16. The device of claim 15, wherein the top portion of the first dielectric layer further comprises:
    a third top surface higher than the second top surface; and a third sidewall connecting the third top surface to the second top surface.

17. The device of claim 15, wherein the UBM contacts both of the first top surface and the second top surface.

18. The device of claim 15, wherein the UBM is physically separated from both of the first top surface and the second top surface by a portion of the second dielectric layer.

19. The device of claim 7, wherein the passivation layer is a conformal layer.

20. The device of claim 15, wherein the first dielectric layer is a conformal layer.

* * * * *